United States Patent
Kodama et al.

(10) Patent No.: US 7,120,881 B2
(45) Date of Patent: Oct. 10, 2006

(54) WIRING GRAPHIC VERIFICATION METHOD, PROGRAM AND APPARATUS

(75) Inventors: Chikaaki Kodama, Kasukabe (JP); Akiihiro Yoshitake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 373 days.

(21) Appl. No.: 10/805,478

(22) Filed: Mar. 22, 2004

(65) Prior Publication Data
US 2005/0005252 A1    Jan. 6, 2005

(30) Foreign Application Priority Data
Apr. 11, 2003    (JP)    ............... 2003-107522

(51) Int. Cl.
*G06F 17/50* (2006.01)
(52) U.S. Cl. .......................................... 716/5
(58) Field of Classification Search .................... 716/5
See application file for complete search history.

(56) References Cited

U.S. PATENT DOCUMENTS

| | | | |
|---|---|---|---|
| 6,427,225 B1* | 7/2002 | Kitada et al. .................. | 716/5 |
| 6,941,531 B1* | 9/2005 | Teig et al. ...................... | 716/5 |
| 2002/0049957 A1* | 4/2002 | Hosono et al. ................ | 716/5 |
| 2004/0205683 A1* | 10/2004 | Kovacs-Birkas et al. ...... | 716/6 |
| 2006/0080634 A1* | 4/2006 | Beale .......................... | 716/21 |

FOREIGN PATENT DOCUMENTS

| | | |
|---|---|---|
| JP | 8-55140 | 2/1993 |
| JP | 11-96200 | 4/1999 |
| JP | 2001-13673 | 1/2001 |

* cited by examiner

*Primary Examiner*—Paul Dinh
*Assistant Examiner*—Suchin Parihar
(74) *Attorney, Agent, or Firm*—Staas & Halsey LLP

(57) ABSTRACT

An edge extraction unit extracts vertical and horizontal wiring edges and slanted wiring edges from overall wiring graphics, and a wiring width classification unit executes a scaling process for the overall wiring graphics to classify the wiring graphics into wiring width ranges which are divided by a predefined reference wiring width. A vertical and horizontal wiring edge extraction unit extracts the vertical and horizontal wiring edges which are in contact with graphics classified into the wiring width ranges, and a vertical and horizontal wiring interval verification unit verifies intervals between the vertical and horizontal wiring edges and opposed edges to be verification counterparts based on a vertical and horizontal reference interval for each wiring width range. A slanted wiring edge extraction unit extracts slanted wiring edges which are in contact with graphics classified into the wiring width ranges, and a slanted wiring interval verification unit verifies intervals between the slanted wiring edges and opposed edges to be verification counterparts based on a slanted reference interval for each wiring width range.

15 Claims, 34 Drawing Sheets

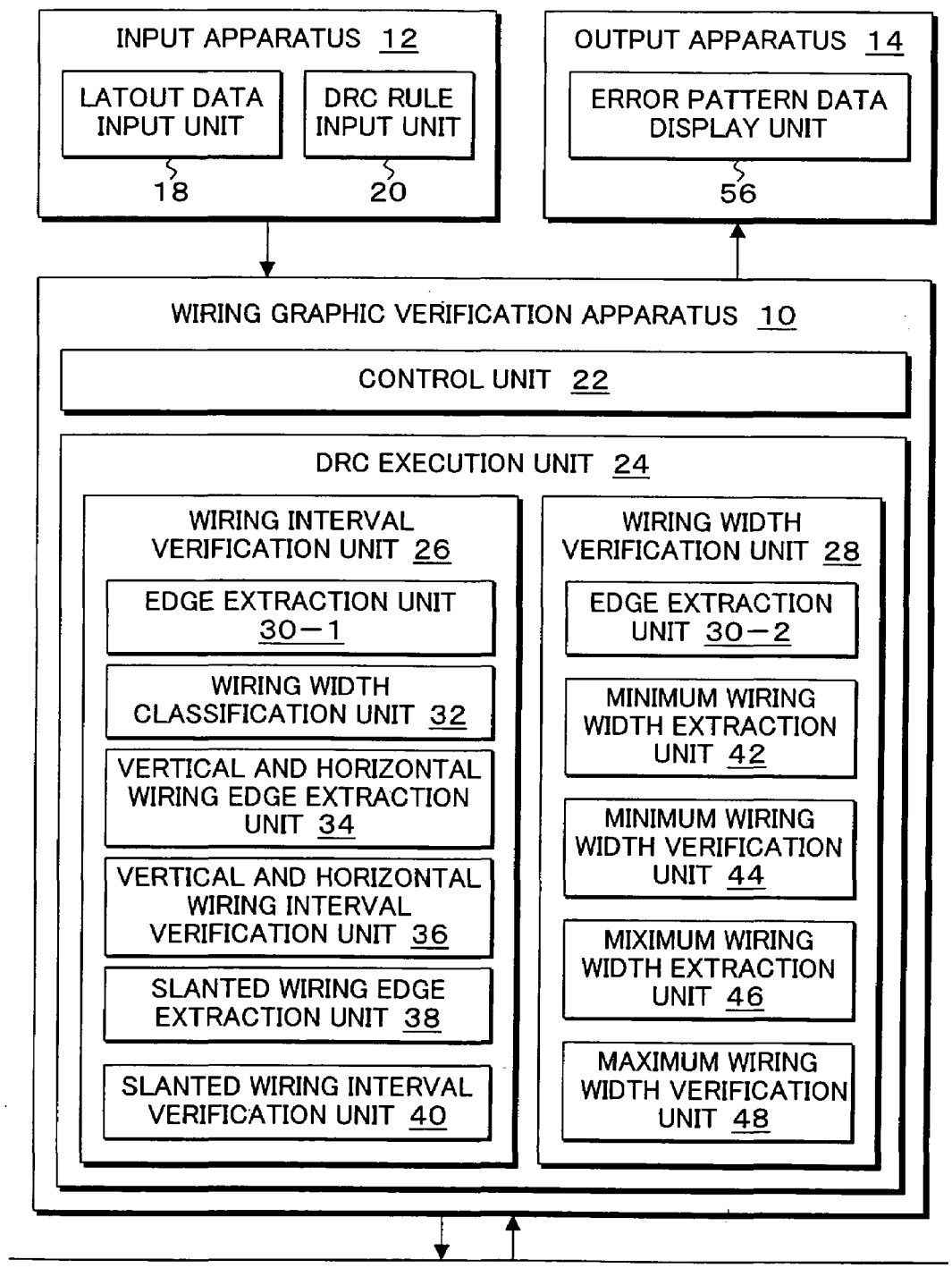

FIG. 1B
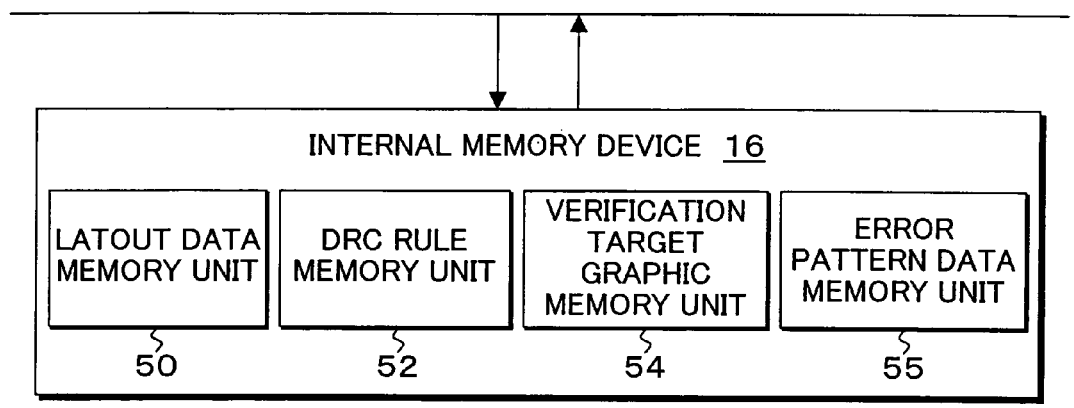

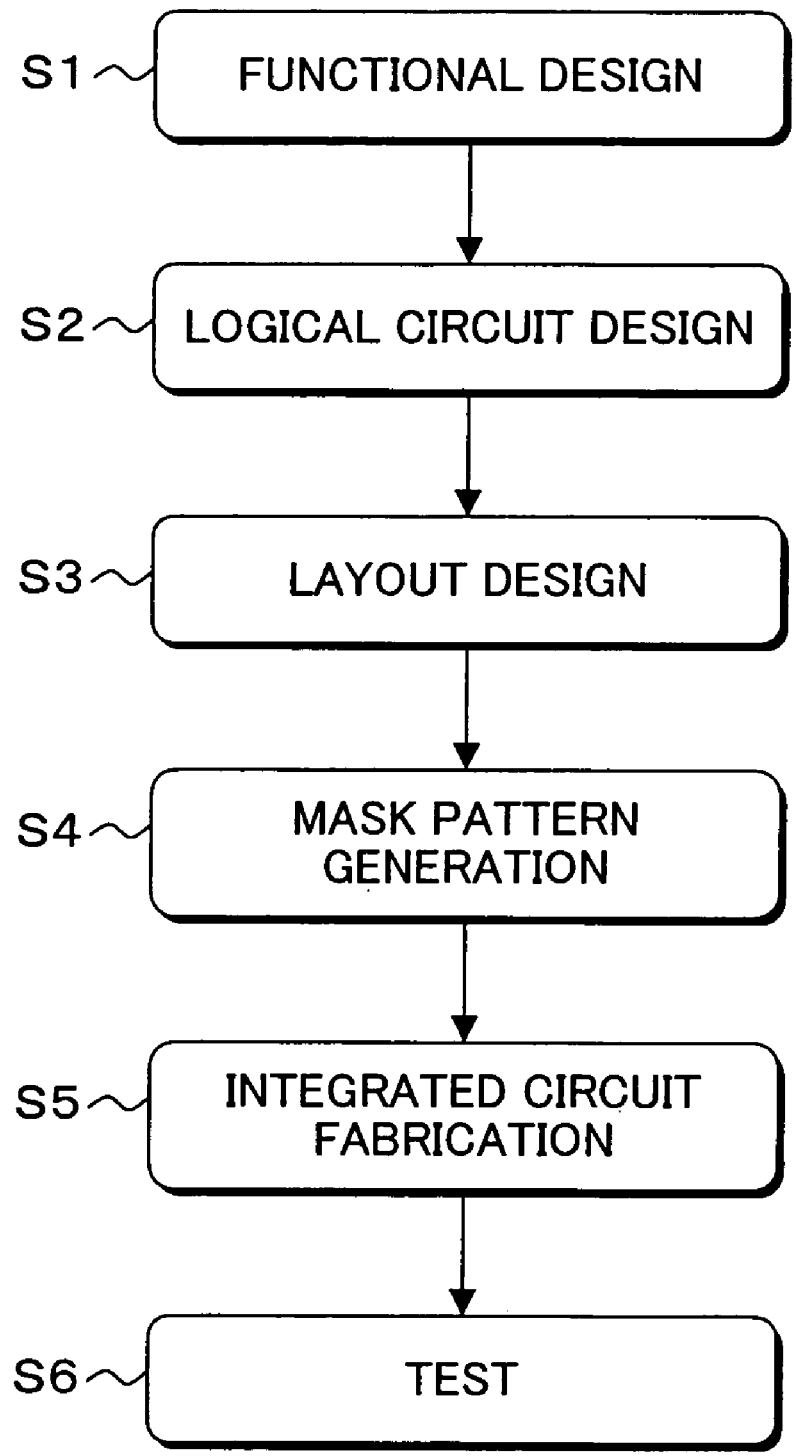

FIG. 4B

| THIRD LAYER WIRING REFERENCE |
|---|
| * THIRD LAYER VERTICAL AND HORIZONTAL WIRING (metal 3) INTERVAL REFERENCE : |
| 3-1-1:   metal 3 VERTICAL AND HORIZONTAL WIRING WIDTH ≦ e1 -> INTERVAL f1 |
| 3-1-2: e1 << metal 3 VERTICAL AND HORIZONTAL WIRING WIDTH ≦ e2 -> INTERVAL f2 |
| 3-1-3: e2 << metal 3 VERTICAL AND HORIZONTAL WIRING WIDTH      -> INTERVAL f3 |
| * THIRD LAYER SLANTED WIRING (metal 3) INTERVAL REFERENCE : |
| 3-2-1:   metal 3 SLANTED WIRING WIDTH ≦ E1 -> INTERVAL F1 |
| 3-2-2: E1 << metal 3 SLANTED WIRING WIDTH ≦ E2 -> INTERVAL F2 |
| 3-2-3: E2 << metal 3 SLANTED WIRING WIDTH       -> INTERVAL F3 |
| *STHIRD LAYER WIRING (metal 3) WIDTH REFERENCE : |
| 3-3-1: MINIMUM WIRING WIDTH -> minw_3 |
| 3-3-2: MAXIMUM WIRING WIDTH -> maxw_3 |
| ... |

60-3, 62-3, 64-3, 66-3, 58

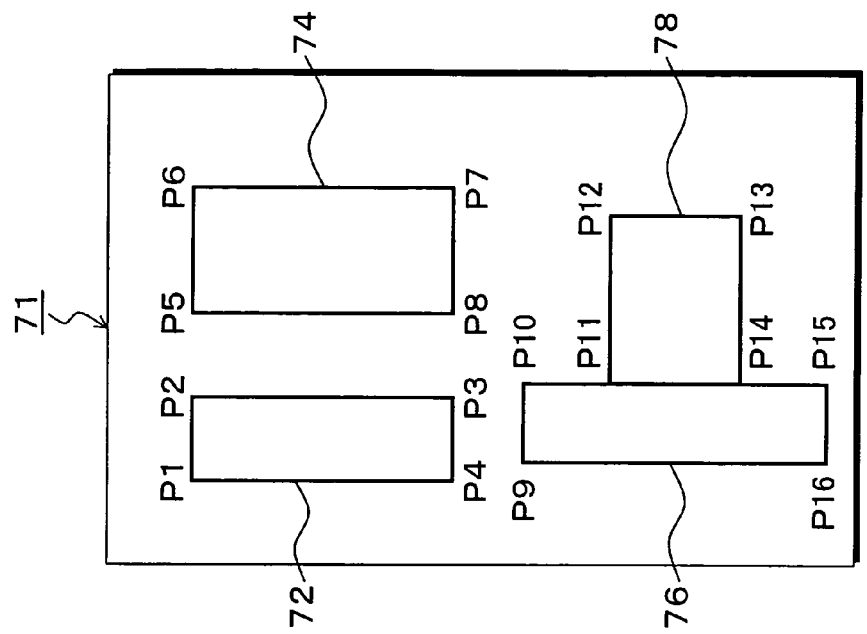
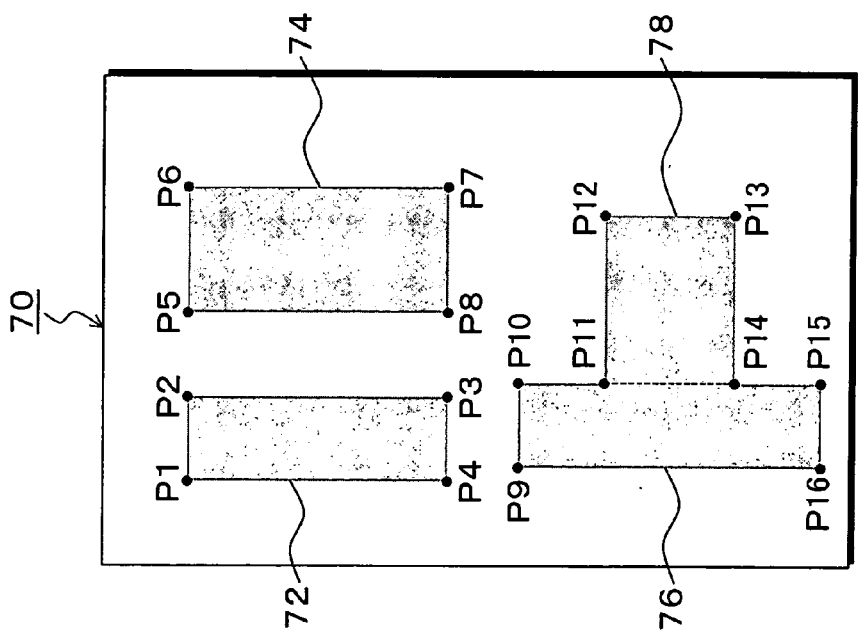

| START COORDINATE S | END COORDINATE E | HALF-VALUE WIDTH W |

| VERTEX | COORDINATE |
|--------|------------|
| P1 | (x1, y1) |
| P2 | (x2, y2) |
| P3 | (x3, y3) |
| P4 | (x4, y4) |

| START POINT | END POINT | INSIDE | OUTSIDE |
|-------------|-----------|--------|---------|
| P1 | P2 | 270° | 90° |
| P2 | P3 | 180° | 0° |
| P3 | P4 | 90° | 270° |
| P4 | P1 | 0° | 180° |

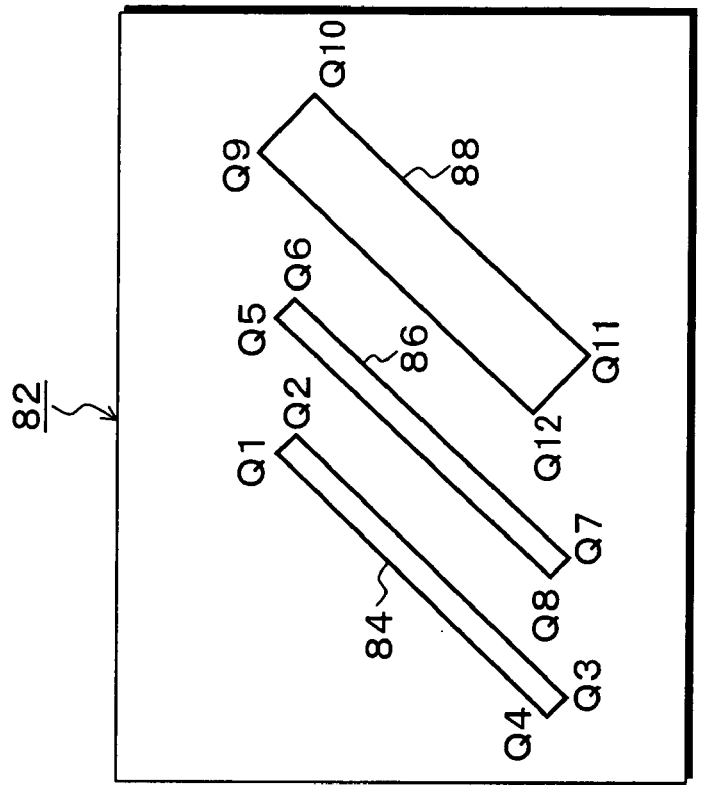
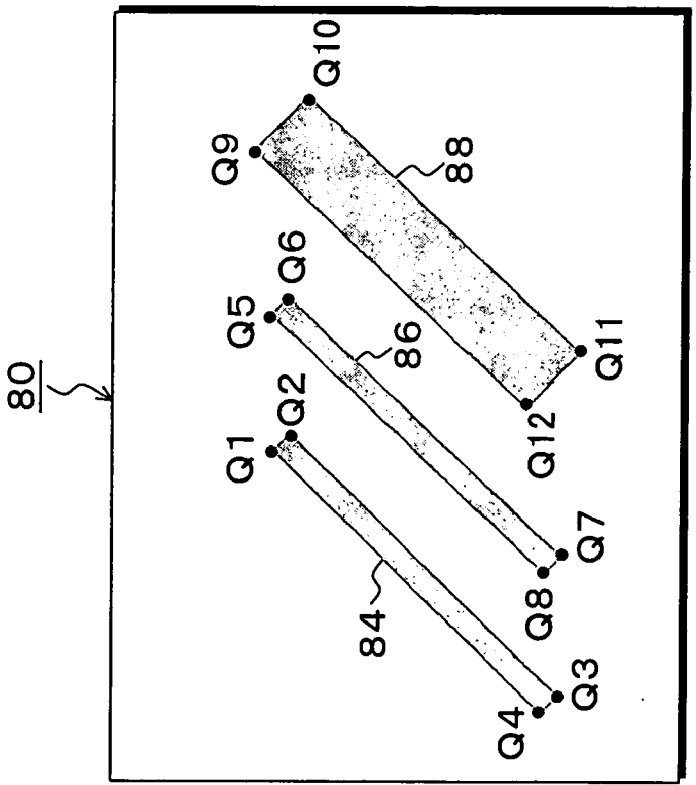

| VERTEX | COORDINATE |
|---|---|
| Q1 | (x1, y1) |
| Q2 | (x2, y2) |
| Q3 | (x3, y3) |
| Q4 | (x4, y4) |

| START POINT | END POINT | INSIDE | OUTSIDE |
|---|---|---|---|
| Q1 | Q2 | 225° | 45° |
| Q2 | Q3 | 135° | 315° |
| Q3 | Q4 | 45° | 225° |
| Q4 | Q1 | 315° | 135° |

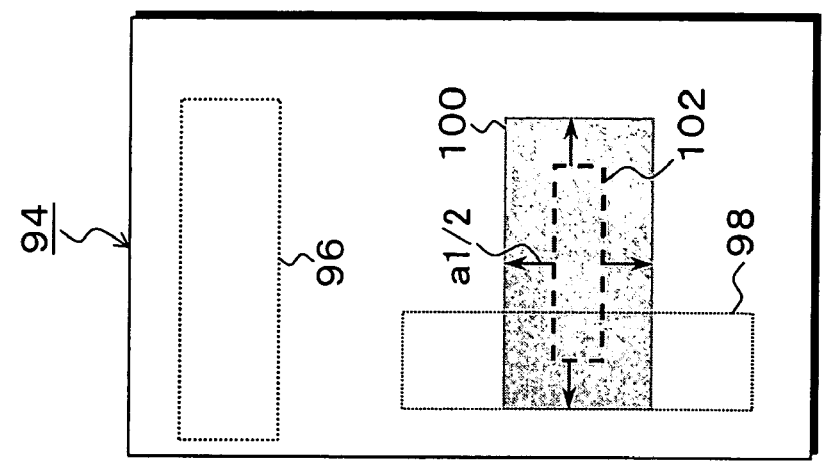
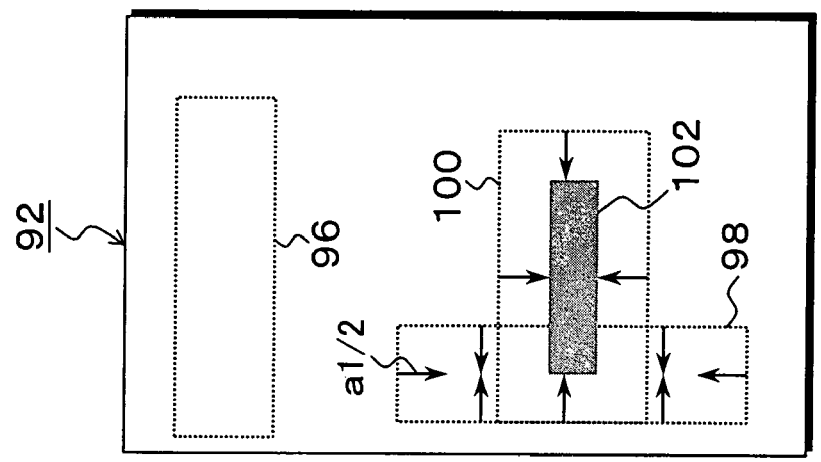
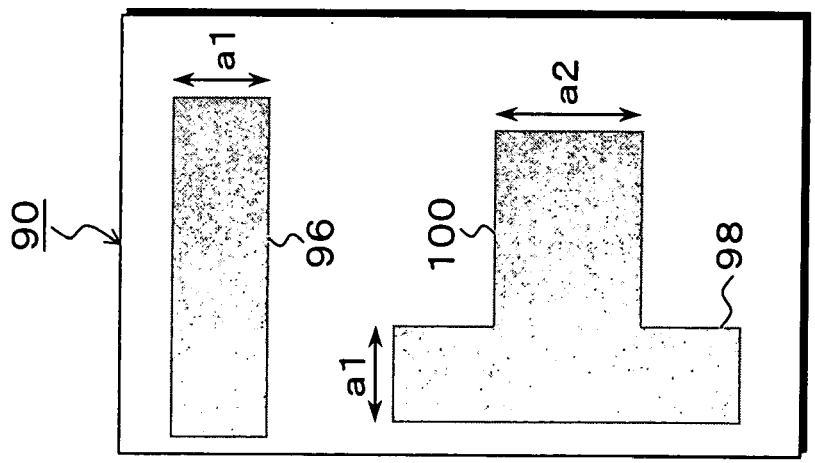

WIRING GRAPHIC VERIFICATION METHOD, PROGRAM AND APPARATUS

BACKGROUND OF THE INVENTION

1. Field of the Invention

The present invention relates generally to a computer-aided wiring graphic verification method, program and apparatus for verifying wiring graphic data for wiring masks created from layout data for circuit design of a large-scale semiconductor integrated circuit, etc., and more particularly to a wiring graphic verification method, program and apparatus for verifying wiring intervals and wiring widths of vertical and horizontal wiring and slanted wiring mixed in the wiring graphic data.

2. Description of the Related Arts

Traditionally, in computer-aided large scale semiconductor integrated circuits design work, a location of devices is determined on the integrated circuit according to a logic circuit diagram or an electronic circuit diagram referred to as a wiring location design of a layout design, and after wiring paths between these devices are determined, a plotting operation for generating mask based on this is performed.

As is well known, in layout design, layout verification is performed. This layout verification is to confirm accuracy of design of plot data (artwork data) for generating mask in final design stage.

In this layout verification, the verification called design rule check (DRC) is performed. This is an operation which verifies that the plot data does not violate geometrical design rules which is designed with various constraint obtained after examining fabrication processes, or the design rules.

In conventional design rule check, it is verified that intervals between wiring graphics and wiring widths do not violate the design rules. In verification of intervals between wiring graphics, verification reference values vary according to the wiring widths. Also, acceptable minimum wiring width and maximum wiring width are defined for each wiring layer.

In verification of wiring intervals targeting the conventional vertical and horizontal wiring, there are a method that extracts wiring graphics which are to be verification targets and checks intervals between the wiring graphics and a method that extracts edges between wirings which are to be verification targets and checks intervals between these edges. Also, for verification of wiring widths, there are a method that extracts wiring graphics which are to be verification targets and checks widths between the wiring graphics and a method that extracts edges between wirings which are to be verification targets and checks intervals between these edges (See Japanese Patent Application Laid-open Pub. Nos. 2001-13673, Hei8-55140 and Hei11-96200).

By the way, in conventional layout design, wiring patterns are arranged in horizontal and vertical directions, but in recent years, slanted wiring in which wiring patterns are arranged in 45 degrees slanted direction has been introduced in order to shorten wiring paths, reduce line resistance and stray capacitance and improve transmission properties associated with higher frequency.

However, in verification of the layout design in case that the vertical and horizontal wiring and the slanted wiring are mixed, if the design reference values for the wiring intervals of the vertical and horizontal wiring and the slanted wiring are different respectively and also if the design reference values for minimum wiring widths and maximum wiring widths of the vertical and horizontal wiring and the slanted wiring are different respectively, then a problem occurs, in which so-called pseudo-errors, which is output as error even when it is not error, is generated by mutual interferences of different design reference values.

In other words, if layout verification is performed according to the design reference value of the vertical and horizontal wiring, the design reference value of the vertical and horizontal wiring is also applied to the slanted wiring and the pseudo-errors is generated. Conversely, if layout verification is performed according to the design reference value of the slanted wiring, the design reference value of the slanted wiring is also applied to the vertical and horizontal wiring and the pseudo-errors is generated.

Therefore, layout verification can not accommodate the layout verification in which the design reference values of the vertical and horizontal wiring and the slanted wiring are different, and different design reference values can not be applied to the vertical and horizontal wiring and the slanted wiring, so the problem occurs, in which the degree of freedom of the layout design is limited.

SUMMARY OF THE INVENTION

It is therefore the object of the present invention to provide a wiring graphic verification method, program and apparatus which enable the layout verification corresponding to different design reference values without generating pseudo-errors, for the wiring graphics in which are mixed the vertical and horizontal wiring and the slanted wiring with different design standards.

(Verification of Wiring Intervals)

In order to achieve the above object, according to a first aspect of the present invention there is provided a computer-aided wiring graphic verification method for verifying wiring intervals in wiring graphic data for wiring masks including vertical and horizontal wiring and slanted wiring created from layout data for a semiconductor integrated circuit designing, the method comprising:

an edge extraction step, by an edge extraction unit, extracting vertical and horizontal wiring edges and slanted wiring edges from overall wiring graphics;

a wiring width classification step, by a wiring width classification unit, executing a scaling process for the overall wiring graphics and classifying the wiring graphics into wiring width ranges which are divided by a predefined reference wiring width;

a vertical and horizontal wiring edge extraction step, by a vertical and horizontal wiring edge extraction unit, extracting the vertical and horizontal wiring edges which are in contact with graphics classified into the wiring width ranges;

a vertical and horizontal wiring interval verification step, by a vertical and horizontal wiring interval verification unit, verifying intervals between the vertical and horizontal wiring edges and opposed edges to be verification counterparts based on a vertical and horizontal reference interval for each wiring width range;

a slanted wiring edge extraction step, by a slanted wiring edge extraction unit, extracting slanted wiring edges which are in contact with graphics classified into the wiring width ranges; and a slanted wiring interval verification step, by a slanted wiring interval verification unit, verifying intervals between the slanted wiring edges and opposed edges to be verification counterparts based on a slanted reference interval for each wiring width range.

In this way, in the wiring graphic verification method of the invention, first, the vertical and horizontal edges and the slanted edges are extracted from the overall wiring graphics in which the vertical and horizontal wiring and the slanted wiring are mixed, and are classified into wiring width ranges by performing the scaling process to the overall wiring graphics, then, by extracting one which contact with the wiring graphics after the scaling process out of previously extracted vertical and horizontal edges and slanted edges, it is possible to individually verify the wiring intervals of the vertical and horizontal wiring and the slanted wiring, with different design reference values, without generating pseudo-errors.

The wiring width classification step may include setting one or more reference wiring widths for defining the wiring width ranges for each of the vertical and horizontal wiring and the slanted wiring.

The wiring width classification step may include, if a single reference wiring width is set for defining the wiring width ranges, executing a reduction process for the overall wiring graphics which moves vertex coordinates toward inside of the graphic by one-half of the reference width to disappear wiring graphics not greater than the reference wiring width, and thereafter executing an enlargement process which moves vertex coordinates of remaining wiring graphics toward outside of the graphic by one-half of the reference wiring width, to thereby perform classification into the wiring graphics not greater than the reference wiring width and the wiring graphics greater than the reference wiring width.

The wiring width classification step may include, if a plurality of reference wiring widths are set for defining the wiring width ranges, selecting the reference wiring width in ascending order or descending order, and repeating the process which includes executing a reduction process for the wiring graphics which moves vertex coordinates toward inside of the graphic by one-half of the selected reference wiring width to disappear wiring graphics not greater than the reference value, and thereafter executing an enlargement process which moves vertex coordinates of remaining graphics toward outside of the graphic by one-half of the reference wiring width, to thereby perform classification into the wiring graphics not greater than the reference wiring width and the wiring graphics greater than the reference wiring width.

The vertical and horizontal wiring width verification step may include verifying whether or not the wiring intervals to the edges of vertical and horizontal wiring graphics opposed to the vertical and horizontal wiring edges violate the reference interval of the vertical and horizontal wiring. This is verification of the wiring interval between the vertical and horizontal wirings.

The slanted wiring width verification step may include verifying whether or not the wiring intervals to the edges of slanted wiring graphics which are located in orthogonal direction to the vertical and horizontal wiring edges toward outside of the graphics violate the reference interval of the vertical and horizontal wiring. This is verification of the wiring interval with the slanted wiring from the viewpoint of the vertical and horizontal wiring, which is verified with the reference interval of the vertical and horizontal wiring.

The slanted wiring width verification step may include verifying whether or not the wiring intervals to the edges of slanted wiring graphics opposed to the slanted wiring edges violate the reference interval of the slanted wiring. This is verification of the wiring interval between the slanted wirings.

The slanted wiring width verification step may include verifying whether or not the wiring intervals to the edges of vertical and horizontal wiring graphics which are located in orthogonal direction to the slanted wiring edges violate the reference interval of the slanted wiring. This is verification of the wiring interval to the vertical and horizontal wiring from the viewpoint of the slanted wiring, which is verified with the reference interval of the slanted wiring.

(Verification of Wiring Widths)

In order to achieve the above object, according to a second aspect of the present invention there is provided a computer-aided wiring graphic verification method for verifying the wiring width in wiring graphic data for wiring masks including vertical and horizontal wiring and slanted wiring created from layout data for semiconductor integrated circuit designing, the method comprising:

an edge extraction step, by an edge extraction unit, extracting vertical and horizontal wiring edges and slanted wiring edges from overall wiring graphics;

a minimum wiring width extraction step, by a minimum wiring width extraction unit, extracting wiring graphics less than predefined minimum wiring width through a scaling process for the overall wiring graphics;

a minimum wiring width verification step, by a minimum wiring width verification unit, extracting vertical and horizontal wiring graphics which are in contact with the vertical and horizontal wiring edges and slanted wiring graphics which are in contact with the slanted wiring edges out of the wiring graphics less than the minimum width, and outputting minimum wiring width errors;

a maximum wiring width extraction step, by a maximum wiring width extraction unit, extracting wiring graphics greater than predefined maximum width through a scaling process for the overall wiring graphics; and a maximum wiring width verification step, by a maximum wiring width verification unit, extracting vertical and horizontal wiring graphics which are in contact with the vertical and horizontal wiring edges and slanted wiring graphics which are in contact with the slanted wiring edges out of the wiring graphics greater than the maximum width, and outputting maximum wiring width errors.

In this way, in the wiring graphic verification method targeting the wiring width, first, the vertical and horizontal edges and the slanted edges are extracted from the overall wiring graphics in which the vertical and horizontal wiring and the slanted wiring are mixed, and the wiring graphics less than minimum wiring width and the wiring graphics greater than maximum wiring width are extracted by performing the scaling process to the overall wiring graphics, then, by extracting one which contact with the wiring graphics after the scaling process out of previously extracted vertical and horizontal edges and slanted edges, it is possible to individually verify the minimum wiring width violations and the maximum wiring width violations for the vertical and horizontal wiring and the slanted wiring respectively, without generating pseudo-errors.

The minimum wiring width extraction step may include executing a reduction process for the overall wiring graphics which moves vertex coordinates toward inside of the graphic by one-half of the minimum wiring width to disappear wiring graphics less than the minimum wiring width, and thereafter executing an enlargement process which moves vertex coordinates of remaining wiring graphics toward outside of the graphic by one-half of the minimum wiring width, to extract graphics from which wiring graphics not greater than the minimum wiring width are eliminated, and removing the extracted graphics from the overall wiring graphics, to thereby extract wiring graphics less than the minimum wiring width.

The maximum wiring width extraction step may include executing a reduction process for the overall wiring graphics which moves vertex coordinates toward inside of the graphic by one-half of the maximum wiring width to disappear wiring graphics less than the maximum wiring width, and thereafter executing an enlargement process which moves vertex coordinates of remaining wiring graphics toward outside of the graphic by one-half of the minimum wiring width, to thereby extract wiring graphics greater than the maximum wiring.

The slanted wiring graphics may be arranged at a slant of 45 degrees relative to the vertical and horizontal directions. Each of the steps may be processed sequentially for each wiring layer.

In order to attain the above object, according to a third aspect of the present invention there is provided a computer-aided wiring graphic verification method for verifying both wiring intervals and wiring widths in wiring graphic data for wiring masks including vertical and horizontal wirings and slanted wirings created from layout data for semiconductor integrated circuit designing, the method comprising:

an edge extraction step, by an edge extraction unit, extracting vertical and horizontal wiring edges and slanted wiring edges from overall wiring graphics;

a wiring width classification step, by a wiring width classification unit, executing a scaling process for the overall wiring graphics and classifying the wiring graphics into wiring width ranges which are divided by a predefined reference wiring width;

a vertical and horizontal wiring edge extraction step, by a vertical and horizontal wiring edge extraction unit, extracting the vertical and horizontal wiring edges which are in contact with graphics classified into the wiring width ranges;

a vertical and horizontal wiring interval verification step, by a vertical and horizontal wiring interval verification unit, verifying intervals between the vertical and horizontal wiring edges and opposed edges to be verification counterparts based on a vertical and horizontal reference interval for each wiring width range;

a slanted wiring edge extraction step, by a slanted wiring edge extraction unit, extracting slanted wiring edges which are in contact with graphics classified into the wiring width ranges;

a slanted wiring interval verification step, by a slanted wiring interval verification unit, verifying intervals between the slanted wiring edges and opposed edges to be verification counterparts based on a slanted reference interval for each wiring width range;

a minimum wiring width extraction step, by a minimum wiring width extraction unit, extracting wiring graphics less than a predefined minimum wiring width through a scaling process for the overall wiring graphics;

a minimum wiring width verification step, by a minimum wiring width verification unit, extracting vertical and horizontal wiring graphics which are in contact with the vertical and horizontal wiring edges and slanted wiring graphics which are in contact with the slanted wiring edges out of the wiring graphics less than the minimum width, and outputting minimum wiring width errors;

a maximum wiring width extraction step, by a maximum wiring width extraction unit, extracting wiring graphics greater than predefined maximum width through a scaling process for the overall wiring graphics; and a maximum wiring width verification step, by a maximum wiring width verification unit, extracting vertical and horizontal wiring graphics which are in contact with the vertical and horizontal wiring edges and slanted wiring graphics which are contact with the slanted wiring edges out of the wiring graphics greater than the maximum width, and outputting maximum wiring width errors.

(Program)

In order to attain the above object, according to a fourth aspect of the present invention there is provided a computer-executed program for verifying wiring intervals in wiring graphic data for wiring masks including vertical and horizontal wiring and slanted wiring created from layout data for semiconductor integrated circuit designing, the program allowing a computer to execute:

an edge extraction step extracting vertical and horizontal wiring edges and slanted wiring edges from overall wiring graphics;

a wiring width classification step executing a scaling process for the overall wiring graphics and classifying the wiring graphics into wiring width ranges which are divided by a predefined reference wiring width;

a vertical and horizontal wiring edge extraction step extracting the vertical and horizontal wiring edges which are in contact with graphics classified into the wiring width ranges;

a vertical and horizontal wiring interval verification step verifying intervals between the vertical and horizontal wiring edges and opposed edges to be verification counterparts based on a vertical and horizontal reference interval for each wiring width range;

a slanted wiring edge extraction step extracting slanted wiring edges which are in contact with graphics classified into the wiring width ranges; and a slanted wiring interval verification step verifying intervals between the slanted wiring edges and opposed edges to be verification counterparts based on a slanted reference interval for each wiring width range.

In order to attain the above object, according to a fifth aspect of the present invention there is provided a computer-executed program for verifying wiring widths in wiring graphic data for wiring masks including vertical and horizontal wiring and slanted wiring created from layout data for semiconductor integrated circuit designing, the program allowing a computer to execute:

an edge extraction step extracting vertical and horizontal wiring edges and slanted wiring edges from overall wiring graphics;

a minimum wiring width extraction step extracting wiring graphics less than predefined minimum wiring width through a scaling process for the overall wiring graphics;

a minimum wiring width verification step extracting vertical and horizontal wiring graphics which are in contact with the vertical and horizontal wiring edges and slanted wiring graphics which are in contact with the slanted wiring edges out of the wiring graphics less than the minimum width, and outputting minimum wiring width errors;

a maximum wiring width extraction step extracting wiring graphics greater than predefined maximum width through a scaling process for the overall wiring graphics; and a maximum wiring width verification step extracting vertical and horizontal wiring graphics which are in contact with the vertical and horizontal wiring edges and slanted wiring graphics which are in contact with the slanted wiring edges out of the wiring graphics greater than the maximum width, and outputting maximum wiring width errors.

In order to attain the above object, according to a sixth aspect of the present invention there is provided a computer-executed program for verifying wiring intervals and wiring widths in wiring graphic data for wiring masks including vertical and horizontal wiring and slanted wiring created from layout data for semiconductor integrated circuit designing, the program allowing a computer to execute:

an edge extraction step extracting vertical and horizontal wiring edges and slanted wiring edges from overall wiring graphics;

a wiring width classification step executing a scaling process for the overall wiring graphics and classifying the wiring graphics into wiring width ranges which are divided by a predefined reference wiring width;

a vertical and horizontal wiring edge extraction step extracting the vertical and horizontal wiring edges which are in contact with graphics classified into the wiring width ranges;

a vertical and horizontal wiring interval verification step verifying intervals between the vertical and horizontal wiring edges and opposed edges to be verification counterparts based on a vertical and horizontal reference interval for each wiring width range;

a slanted wiring edge extraction step extracting slanted wiring edges which are in contact with graphics classified into the wiring width ranges;

a slanted wiring interval verification step verifying intervals between the slanted wiring edges and opposed edges to be verification counterparts based on a slanted reference interval for each wiring width range;

a minimum wiring width extraction step extracting wiring graphics less than a predefined minimum wiring width through a scaling process for the overall wiring graphics;

a minimum wiring width verification step extracting vertical and horizontal wiring graphics which are in contact with the vertical and horizontal wiring edges and slanted wiring graphics which are in contact with the slanted wiring edges out of the wiring graphics less than the minimum width, and outputting minimum wiring width errors;

a maximum wiring width extraction step extracting wiring graphics greater than predefined maximum width through a scaling process for the overall wiring graphics; and a maximum wiring width verification step extracting vertical and horizontal wiring graphics which are in contact with the vertical and horizontal wiring edges and slanted wiring graphics which are contact with the slanted wiring edges out of the wiring graphics greater than the maximum width, and outputting maximum wiring width errors.

(Apparatus)

In order to attain the above object, according to a seventh aspect of the present invention there is provided a computer-aided wiring graphic verification apparatus for verifying wiring intervals in wiring graphic data for wiring masks including vertical and horizontal wiring and slanted wiring created from layout data for semiconductor integrated circuit designing, the apparatus comprising:

an edge extraction unit extracting vertical and horizontal wiring edges and slanted wiring edges from overall wiring graphics;

a wiring width classification unit executing a scaling process for the overall wiring graphics and classifying the wiring graphics into wiring width ranges which are divided by a predefined reference wiring width;

a vertical and horizontal wiring edge extraction unit extracting the vertical and horizontal wiring edges which are in contact with graphics classified into the wiring width ranges;

a vertical and horizontal wiring interval verification unit verifying intervals between the vertical and horizontal wiring edges and opposed edges to be verification counterparts based on a vertical and horizontal reference interval for each wiring width range;

a slanted wiring edge extraction unit extracting slanted wiring edges which are in contact with graphics classified into the wiring width ranges; and a slanted wiring interval verification unit verifying intervals between the slanted wiring edges and opposed edges to be verification counterparts based on a slanted reference interval for each wiring width range.

In order to attain the above object, according to an eighth aspect of the present invention there is provided a computer-aided wiring graphic verification apparatus for verifying wiring widths in wiring graphic data for wiring masks including vertical and horizontal wiring and slanted wiring created from layout data for semiconductor integrated circuit designing, the apparatus comprising:

an edge extraction unit extracting vertical and horizontal wiring edges and slanted wiring edges from overall wiring graphics;

a minimum wiring width extraction unit extracting wiring graphics less than predefined minimum wiring width through a scaling process for the overall wiring graphics;

a minimum wiring width verification unit extracting vertical and horizontal wiring graphics which are in contact with the vertical and horizontal wiring edges and slanted wiring graphics which are in contact with the slanted wiring edges out of the wiring graphics less than the minimum width, the minimum wiring width verification unit outputting minimum wiring width errors;

a maximum wiring width extraction unit, extracting wiring graphics greater than predefined maximum width through a scaling process for the overall wiring graphics; and a maximum wiring width verification unit extracting vertical and horizontal wiring graphics which are in contact with the vertical and horizontal wiring edges and slanted wiring graphics which are in contact with the slanted wiring edges out of the wiring graphics greater than the maximum width, the maximum wiring width verification unit outputting maximum wiring width errors.

In order to attain the above object, according to a ninth aspect of the present invention there is provided a computer-aided wiring graphic verification apparatus for verifying both the wiring intervals and wiring widths in wiring graphic data for wiring masks including vertical and horizontal wirings and slanted wirings created from layout data for semiconductor integrated circuit designing, the apparatus comprising:

an edge extraction unit extracting vertical and horizontal wiring edges and slanted wiring edges from overall wiring graphics;

a wiring width classification unit executing a scaling process for the overall wiring graphics and classifying the wiring graphics into wiring width ranges which are divided by a predefined reference wiring width;

a vertical and horizontal wiring edge extraction unit extracting the vertical and horizontal wiring edges which are in contact with graphics classified into the wiring width ranges;

a vertical and horizontal wiring interval verification unit verifying intervals between the vertical and horizontal wiring edges and opposed edges to be verification counterparts based on a vertical and horizontal reference interval for each wiring width range;

a slanted wiring edge extraction unit extracting slanted wiring edges which are in contact with graphics classified into the wiring width ranges;

a slanted wiring interval verification unit verifying intervals between the slanted wiring edges and opposed edges to be verification counterparts based on a slanted reference interval for each wiring width range;

a minimum wiring width extraction unit extracting wiring graphics less than a predefined minimum wiring width through a scaling process for the overall wiring graphics;

a minimum wiring width verification unit extracting vertical and horizontal wiring graphics which are in contact with the vertical and horizontal wiring edges and slanted wiring graphics which are in contact with the slanted wiring edges out of the wiring graphics less than the minimum width, the minimum wiring width verification unit outputting minimum wiring width errors;

a maximum wiring width extraction unit extracting wiring graphics greater than predefined maximum width through a scaling process for the overall wiring graphics; and a maximum wiring width verification unit extracting vertical and horizontal wiring graphics which are in contact with the vertical and horizontal wiring edges and slanted wiring graphics which are contact with the slanted wiring edges out of the wiring graphics greater than the maximum width, the maximum wiring width verification unit outputting maximum wiring width errors.

The above and other objects, aspects, features and advantages of the present invention will become more apparent from the following detailed description when taken in conjunction with the accompanying drawings.

BRIEF DESCRIPTION OF THE DRAWINGS

FIGS. 1A and 1B are block diagrams of a system structure where a wiring graphic verification process of the invention is executed;

FIG. 3 is an operation schematic diagram of semiconductor integrated circuit design including wiring graphic verification according to the invention;

FIGS. 4A and 4B are schematic diagrams of design rules used in wiring graphic verification of the invention;

FIGS. 9A and 9B schematic diagrams of wiring graphics and edges graphics for vertical and horizontal wiring in the invention;

FIGS. 11A and 11B are schematic diagrams of a graphic data structure and an edge data structure for vertical and horizontal wiring;

FIGS. 12A and 12B are schematic diagrams of wiring graphics and edge graphics for slanted wiring in the invention;

FIGS. 13A and 13B are schematic diagrams of a graphic data structure and an edge data structure for slanted wiring;

FIG. 14A to 14C are schematic diagrams of a scaling process which eliminates wiring graphics less than wiring width reference value a1;

DESCRIPTION OF THE PREFERRED EMBODIMENTS

Figure 2:
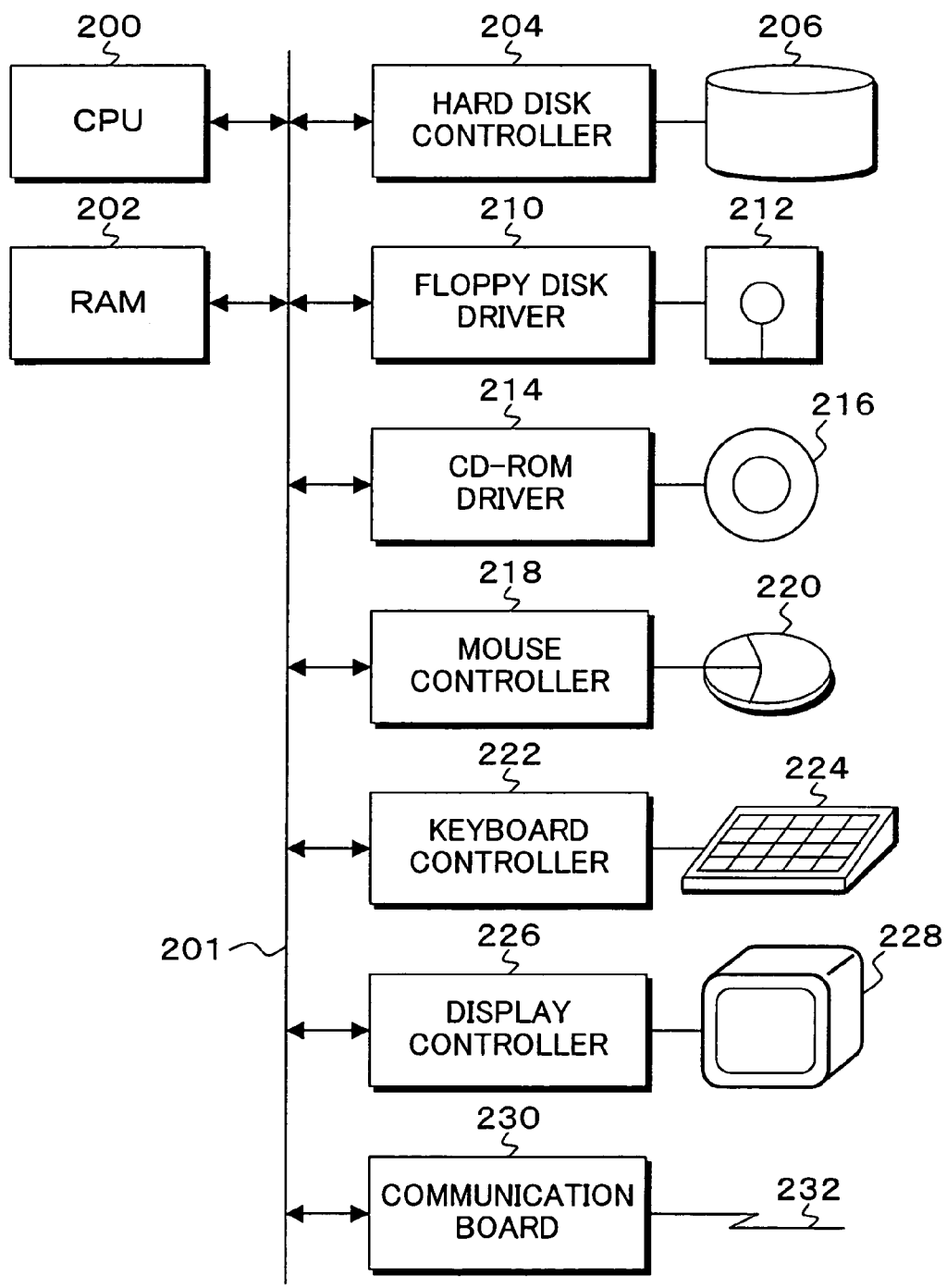
FIG. 2 is a schematic diagram of a hardware environment of a computer to which a wiring graphic verification apparatus of FIGS. 1A and 1B is applied.

FIGS. 1A and 1B are block diagrams of a system structure where a wiring graphic verification process of the invention is executed. In FIGS. 1A and 1B, a system where the wiring graphic verification process of the invention is executed consists of a wiring graphic verification apparatus 10, an input apparatus 12, an output apparatus 14 and an internal memory device 16 of the wiring graphic verification apparatus 10.

The input apparatus 12 is provided with a layout data input unit 18 and a DRC rule input unit 20. The layout data input unit 18 inputs layout data for which the design process is completed and stores it into a layout data memory unit 50 of the internal memory device 16.

The DRC rule input unit 20 inputs DRC rules which are execution information to execute design rule checks of the wiring graphics generated from the input layout data, and stores it into a DRC rule memory unit 52.

The wiring graphic verification apparatus 10 is provided with a control unit 22 and a DRC execution unit 24. The DRC execution unit 24 is provided with a wiring interval verification unit 26 and a wiring width verification unit 28 in order to execute verification processes of the wiring intervals and the wiring widths for the wiring graphics in which the vertical and horizontal wiring and the slanted wiring are mixed, according to the invention.

The wiring interval verification unit 26 is provided with an edge extraction unit 30-1, a wiring width classification unit 32, a vertical and horizontal wiring edge extraction unit 34, a vertical and horizontal wiring interval verification unit 36, a slanted wiring edge extraction unit 38 and a slanted wiring interval verification unit 40, as functions achieved by the program control.

Also, the wiring width verification unit 28 is provided with an edge extraction unit 30-2, a minimum wiring width extraction unit 42, a minimum wiring width verification unit 44, a maximum wiring width extraction unit 46 and a maximum wiring width verification unit 48.

In this point, the edge extraction units 30-1, 30-2 provided to the wiring interval verification unit 26 and the wiring width verification unit 28 are the same units, and if the process is started from the wiring interval verification unit 26, it is possible to use the extraction result of the edge extraction units 30-1 in the wiring width verification unit 28 directly, therefore only the edge extraction unit in which the verification is started first is enabled.

Corresponding to these process functions of the DRC execution unit 24, the internal memory device 16 is provided with a verification target graphic memory unit 54 and an error pattern data memory unit 55 which stores error pattern data obtained from the verification result. Also, the output apparatus 14 is provided with an error pattern data display unit 56 which displays error pattern data obtained as the verification result of the DRC execution unit 24.

The process details of each function unit provided to the wiring interval verification unit 26 of the DRC execution unit 24 are as follows. The edge extraction unit 30-1 extracts vertical and horizontal wiring edges and slanted wiring edges from the overall wiring graphics which are the verification target. The wiring width classification unit 32 performs scaling of the overall wiring graphics and classifies wiring graphics into predefined wiring width ranges divided by the reference wiring width.

The vertical and horizontal wiring edge extraction unit 34 extracts the vertical and horizontal wiring edges which contact with the wiring graphics classified into the wiring width ranges. The vertical and horizontal wiring interval verification unit 36 verifies the interval between the vertical and horizontal wiring edge and an opposed edge which is the verification counterpart based on the vertical and horizontal reference interval for each wiring width range.

The slanted wiring edge extraction unit 38 extracts the slanted wiring edges which contact with the wiring graphics classified into the wiring width ranges. The slanted wiring interval verification unit 40 verifies the interval between the slanted wiring edge and an opposed edge which is the verification counterpart based on the slanted reference interval for each wiring width range.

On the other hand, the process details of each function unit of the wiring width verification unit 28 are as follows. The edge extraction unit 30-2 is the same as the edge extraction unit 30-1 of the wiring interval verification unit 26, and in practice, the vertical and horizontal wiring edges and the slanted wiring edges extracted by the edge extraction unit 30-1 from the overall wiring graphics are directly used as the extraction results.

The minimum wiring width extraction unit 42 extracts wiring graphics less than the minimum wiring width predefined in advance from the vertical and horizontal wiring and the slanted wiring by the scaling process to the overall wiring graphics. The minimum wiring width verification unit 44 extracts the vertical and horizontal wiring graphics which contact with the vertical and horizontal wiring edges and the slanted wiring graphics which contact with the slanted wiring edges out of the wiring graphics less than minimum wiring width, and outputs minimum wiring errors.

The maximum wiring width extraction unit 46 extracts wiring graphics greater than the predefined maximum wiring width from the vertical and horizontal wiring and the slanted wiring respectively, by the scaling process to the overall wiring graphics. The maximum wiring width verification unit 48 extracts the vertical and horizontal wiring graphics which contact with the vertical and horizontal wiring edges and the slanted wiring graphics which contact with the slanted wiring edges out of the wiring graphics greater than maximum wiring width, and outputs maximum wiring errors respectively.

The wiring graphic verification apparatus 10 of the invention in FIGS. 1A and 1B is achieved by hardware resources of a computer as shown in FIG. 2, for example. In the computer of FIG. 2, a bus 201 of CPU 200 is connected with RAM 202, a hard disk controller (software) 204, a floppy disk driver (software) 210, a CD-ROM driver (software) 214, a mouse controller 218, a keyboard controller 222, a display controller 226 and a communication board 230.

The hard disk controller 204 is connected with a hard disk drive 206 and loaded with an application program which executes the wiring graphic verification process of the invention, and calls a necessary program from the hard disk drive 206 at startup of the computer, deploys the program on RAM 202 and executes it in CPU 200.

The floppy disk driver 210 is connected with a floppy disk drive (hardware) 212 and can read from and write to a floppy disk (R). The CD-ROM driver 214 is connected with a CD drive (hardware) 216 and can read data and programs stored in CD.

The mouse controller 218 transfers input operations with the mouse 220 to CPU 200. The display controller 226 performs the display on the display unit 228. The communication board 230 uses a communication line 232 and communicates with other computers or servers.

FIG. 3 is an operation schematic diagram of a computer-aided semiconductor integrated circuit design process including layout design in which the wiring graphic verification process of the invention is executed.

In this operation of the semiconductor integrated circuit design process, first, the functional design is performed in step S1, wherein the functional structure of the overall chip is determined. Subsequently, the logical circuit design is performed in step 2, wherein circuit parameters and connections between circuits are determined. Then, the layout design is performed in step S3, wherein the arrangement of cells and wiring are conducted.

This layout design is generally performed in procedures of a cell arrangement process, an outline wiring process and a detailed wiring process. In the layout design, a layout verification is performed, targeting the layout data obtained when the arrangement of cells and wiring are completed, and in this layout verification, the verifications of the wiring intervals and the wiring widths are performed, targeting the wiring graphics in which the vertical and horizontal wiring and the slanted wiring are mixed, with the design rule check (DRC) according to the invention.

After the layout design is completed, a mask pattern is generated in step S4, and then the integrated circuit based on the mask pattern generated in step S5 is fabricated, and finally fabricated integrated circuit is tested in step S6.

Figure 4A:
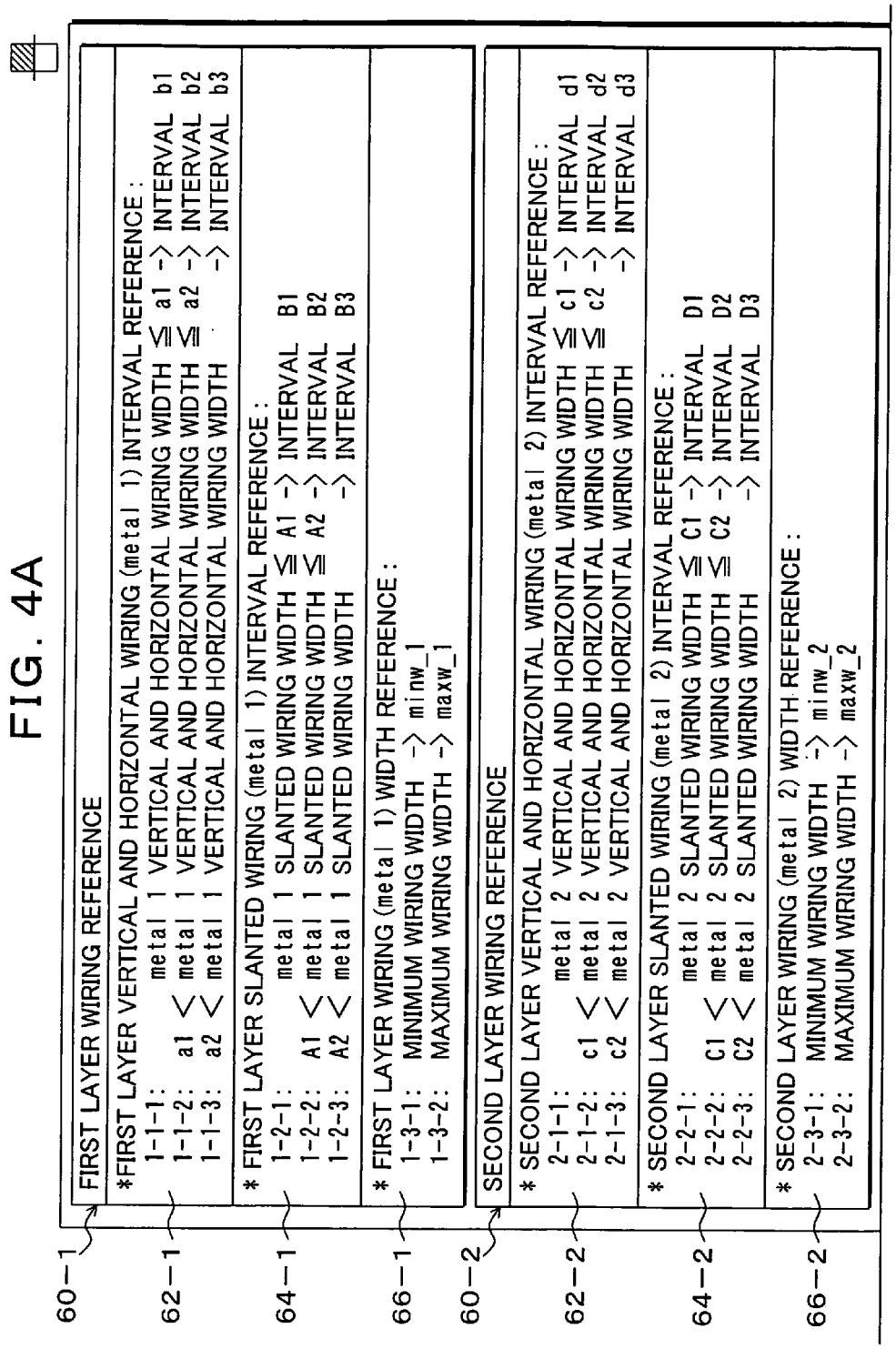

FIGS. 4A and 4B show an example of the design rules 58 used in the wiring graphic verification of the invention. In FIGS. 4A and 4B, the design rules 58 are generated for each wiring layer, and in this example, a first layer wiring reference 60-1, a second layer wiring reference 60-2 and a third layer wiring reference 60-3 are shown.

Taking the first layer wiring reference 60-1 as an example, the content of the reference for each wiring layer consists of a first layer vertical and horizontal wiring interval reference 62-1, a first layer slanted wiring interval reference 64-1 and a first layer wiring width reference 66-1.

In the content of the first layer vertical and horizontal wiring interval reference 62-1, wiring width reference values a1, a2 are set to divide the vertical and horizontal wiring widths into three (3) level ranges, which are:
(1) a wiring width range not greater than a1;
(2) a wiring width range greater than a1 and not greater than a2; and
(3) a wiring width range greater than a2. And, corresponding to these three (3) vertical and horizontal wiring width ranges, b1, b2 and b3 are set as interval reference values for verifying the vertical and horizontal wiring intervals.

The same applies to the next first layer slanted wiring interval reference 64-1 and it is divided into three ranges, which are:
(1) a wiring width range not greater than A1;
(2) a wiring width range greater than A1 and not greater than A2; and
(3) a wiring width range greater than A2, and for each range, B1, B2 and B3 are set as interval reference values for the slanted wiring.

Further, a minimum wiring width=minw_1 and a maximum wiring width maxw_1 are set as the first layer wiring width references 66-1. In addition, for the minimum wiring width and the maximum wiring width, although common width references are set for the vertical and horizontal wiring and the slanted wiring in this example, it is possible to ser different maximum wiring widths and minimum wiring widths for the vertical and horizontal wiring and the slanted wiring.

Figure 5:
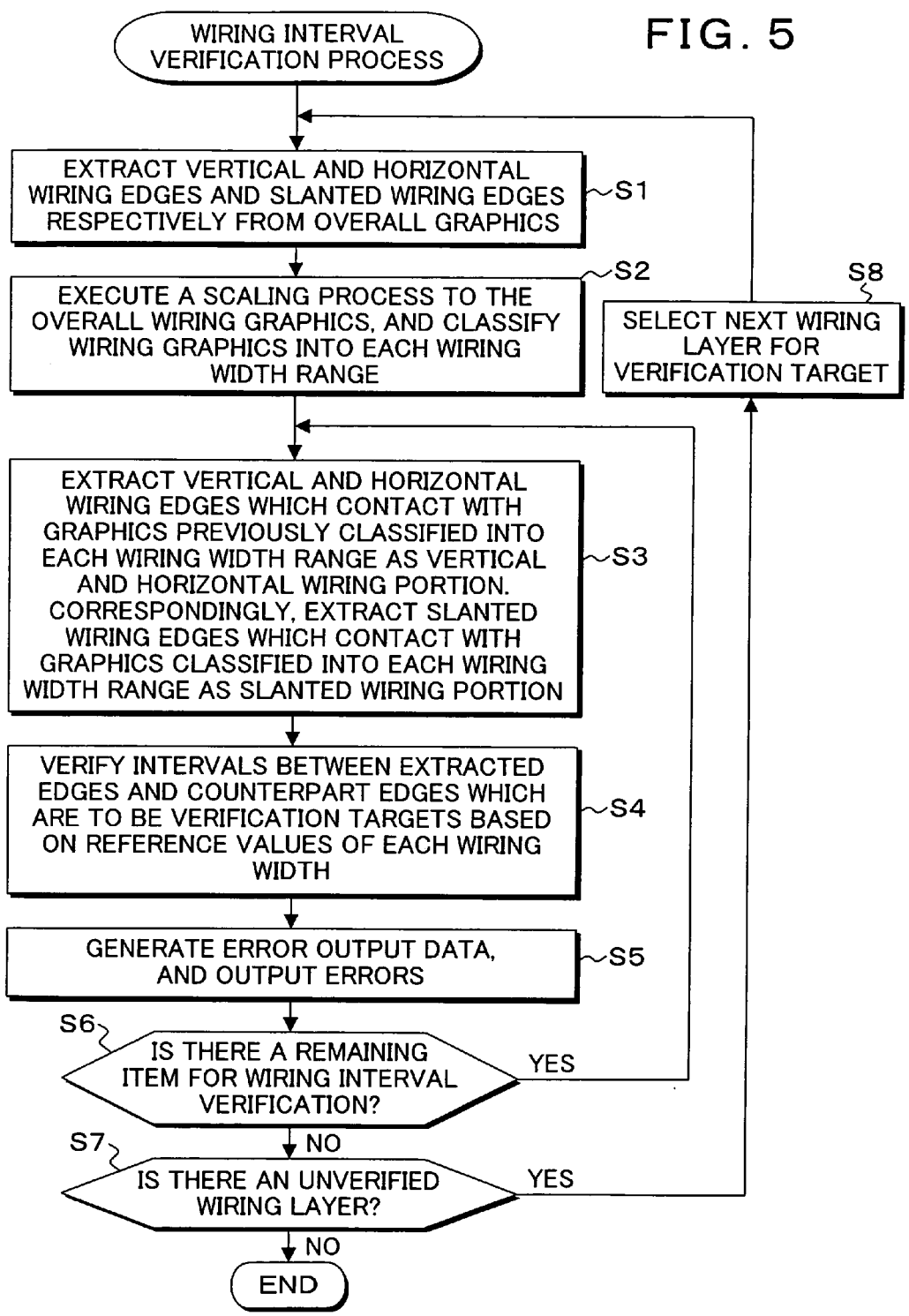
FIG. 5 is a flowchart of a wiring interval verification process according to the invention.

FIG. 5 is a flowchart of the wiring interval verification process according to the invention. This wiring interval verification process is as follows.

Step S1:
Extract the vertical and horizontal wiring edges and the slanted wiring edges respectively from the overall wiring graphics.

Step S2:
Execute a scaling process to the overall wiring graphics, and classify wiring graphics into each wiring width range.

Step S3:
Extract the vertical and horizontal wiring edges extracted in step S1 which contact with graphics classified into each wiring width range in step S2. Correspondingly, extract the slanted wiring edges extracted in step S1 which contact with graphics classified into each wiring width range.

Step S4:
Verify the intervals between the edges extracted in step S3 and counterpart edges which are to be the verification targets thereof, based on the reference values of each wiring width, for the vertical and horizontal wiring and the slanted wiring respectively.

Step S5:
Generate error output data for the wiring intervals violating against the reference intervals in step S4, and output errors.

Step S6:
If there is a remaining item for the wiring interval verification, back to step S3, and if there is not the remaining item, proceed to step s7.

Step S7:
Checks whether there is an unverified wiring layer or not, and if there is, then proceed to step S8, and if there is not, terminate the process.

Step S8:
Select next wiring layer for the verification target and back to step S1.

Figure 6:
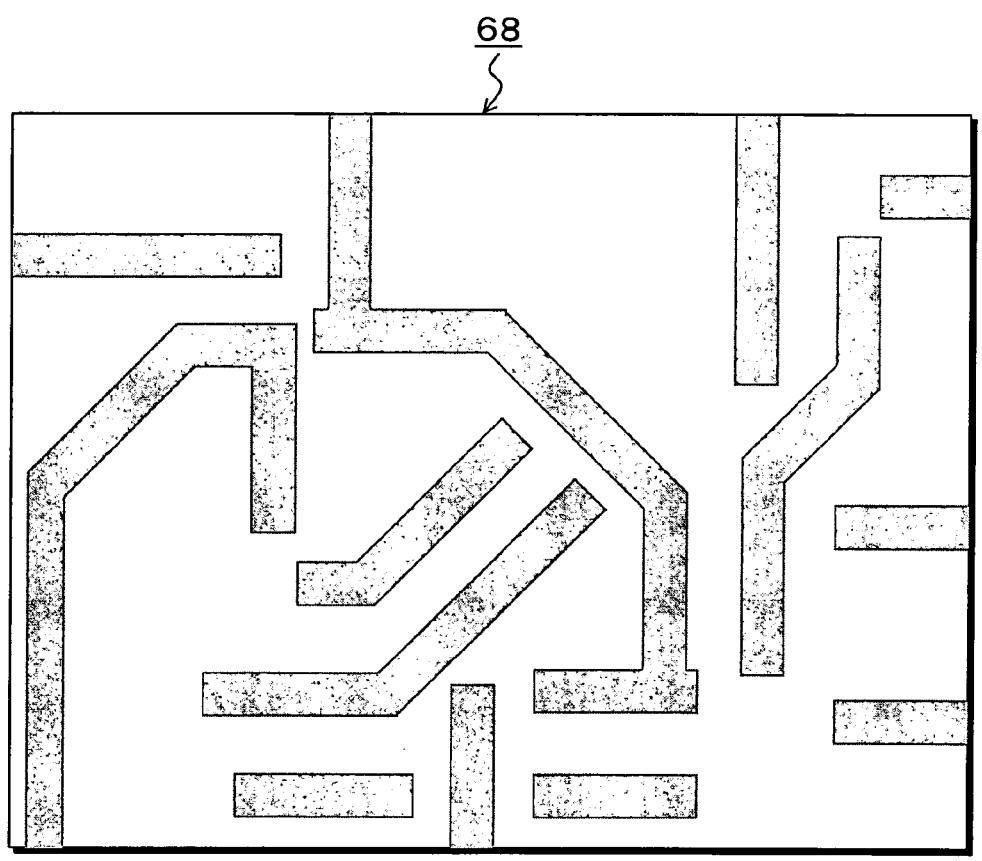
FIG. 6 is a schematic diagram of an example of wiring graphics which are to be verification targets of the invention.

FIG. 6 shows an example of a wiring graphics 68 which are to be targets of the wiring interval verification process of the invention. In this wiring graphics 68, the vertical wiring and the slanted wiring are mixed. The slanted wiring is the wiring arranged in 45 degrees slanted direction relative to the vertical and horizontal direction. For such wiring graphics 68, in the wiring interval verification process, the vertical and horizontal wiring edges and the slanted wiring edges has been extracted from the overall wiring graphics 68 in step S1 for a start.

Figure 7:
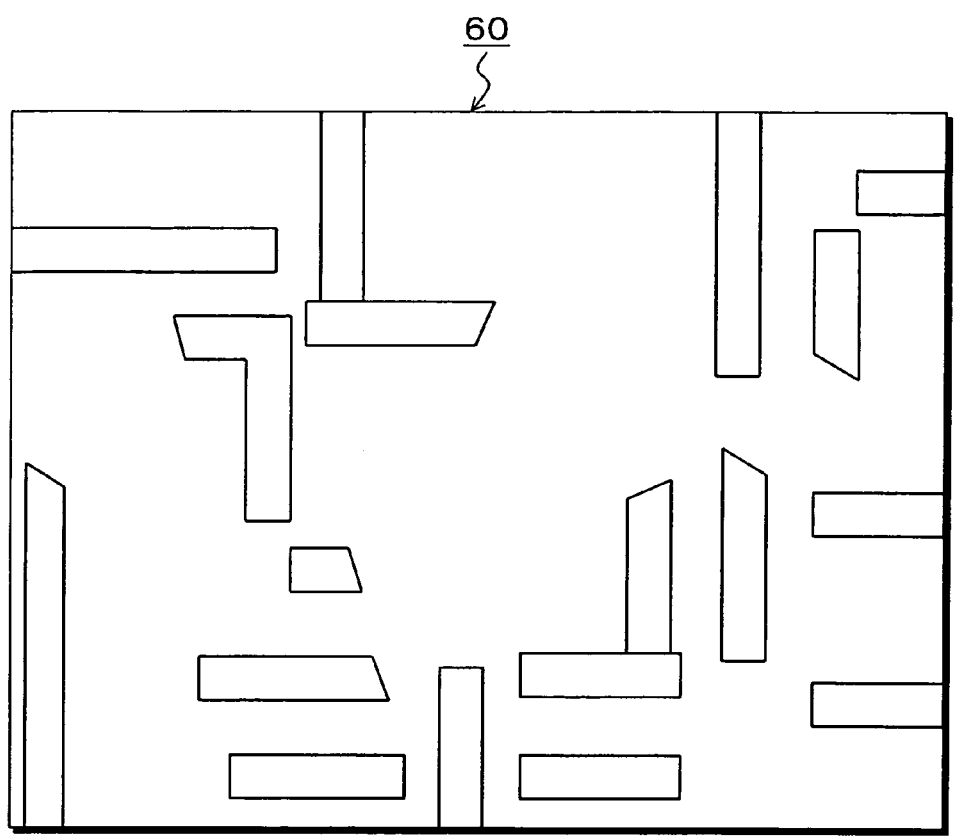
FIG. 7 is a schematic diagram of vertical and horizontal wiring edge extraction graphics extracted from wiring graphics of FIG. 6.
Figure 8:
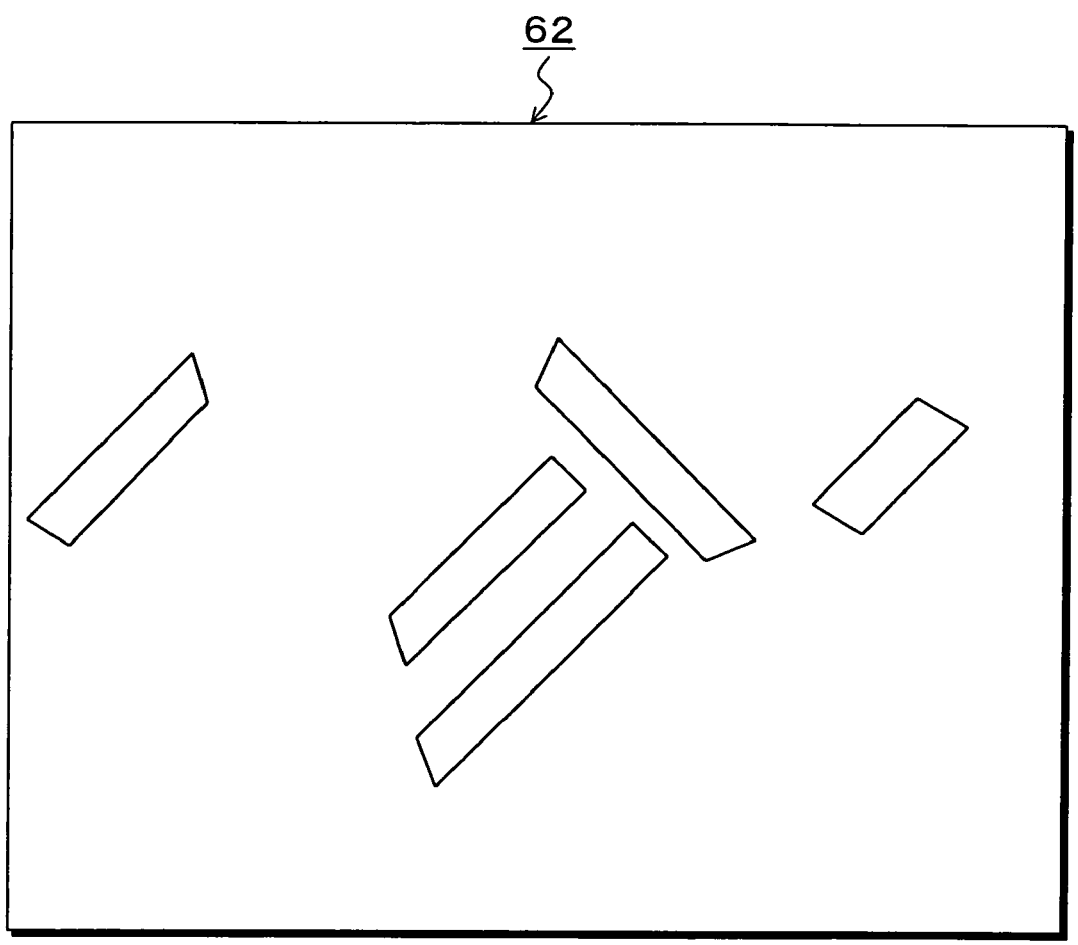
FIG. 8 is a schematic diagram of slanted wiring edge extraction graphics extracted from wiring graphics of FIG. 6.

FIG. 7 is a vertical and horizontal wiring edge extraction graphics 60 extracted from the wiring graphics 68 of FIG. 6. Also, FIG. 8 is a slanted wiring edge extraction graphics 70 extracted from the wiring graphics 68 of FIG. 6.

Here, the data structure of wiring graphics and edge graphics in the wiring graphic verification of the invention will be described. FIG. 9A is wiring graphics 70 of the vertical and horizontal wiring, and edge graphics 71 corresponding to this is shown in FIG. 9B.

In this example, the vertical and horizontal graphics 74, 76 and 78 are arranged as wiring graphics 70, and each vertical and horizontal wiring graphic is constructed from polygon data of vertex coordinates. For example, since the vertical and horizontal wiring graphic 72 has four vertexes P1, P2, P3 and P4, it has the data structure of vertex coordinates for these four vertexes P1 to P4.

As opposed to this, the edge graphic 71, for example a vertical and horizontal wiring graphic 72, is constructed from combinations of adjacent vertexes of vertexes P1 to P4, and further, the edge with two (2) vertexes, for example, P1 and P2, is combined with information indicating inside and outside of the edge.

Figures 10A, 10B:
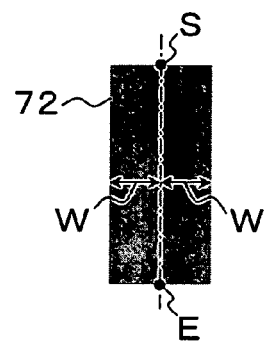
FIGS. 10A and 10B are schematic diagrams of a graphic data format which is input into a verification process.

FIGS. 10A and 10B are schematic diagrams of a graphic data format which is input into the input apparatus 12 of FIGS. 1A and 1B as the layout data. Taking the vertical and horizontal wiring graphic 72 as an example, as shown in FIG. 10A, this input graphic data format is defined by a start coordinate S and an end coordinate E for a center line of the vertical and horizontal wiring graphic 72 as well as by right and left wiring widths W to the center line, and has a structure of a wiring data 73 as shown in FIG. 10B.

This input wiring data shown in FIGS. 10A and 10B is converted to the polygon data shown in FIG. 9A in the layout data input unit 18 of FIGS. 1A and 1B and stored in the verification target graphic memory unit 54.

FIG. 11A is the vertical and horizontal wiring graphic data 75 for the vertical and horizontal wiring graphic 72 in FIG. 9A and consists of coordinates (x1, y,) to (x4, y4) of vertexes P1 to P4. Also, FIG. 11B is the vertical and horizontal wiring graphic data 77 for the edge graphic 71 in FIG. 9B, considers adjacent vertexes as the start point and the end point, and, for the edge connecting the start point and the end point, as information indicating inside and outside of the graphic, stores degrees of the angle indicating directions of coordinate axes of the two-dimensional coordinate system in the two-dimensional space of the wiring graphic in this example.

For example, in the edge data with the stat point P1 and the end point P2, a direction of 270 degrees in the two-dimensional coordinate system, which is the underside of the edge, indicates inside, and a direction of 90 degrees, which is the upside of the edge, indicates outside.

In this way, the information indicating inside and outside of graphics is added to the vertical and horizontal wiring edge data, therefore, with the opposed edges toward the inside direction, the wiring width can be verified, on the other hand, with the interval between the edge and the opposed edge toward the outside direction, the wiring interval can be verified.

FIGS. 12A and 12B are schematic diagrams corresponding to data structures of the wiring graphic and the edge graphic of the slanted wiring in the invention. FIG. 12A is wiring graphics 80 in which slanted wiring graphics 84, 86 and 88 are arranged, and each slanted wiring graphic are constructed from the polygon data according to vertex coordinates. For example, taking a wiring graphic 84 as an example, the slanted wiring graphic data 85 consists of coordinates (x1, y1) to (x4, y4) of vertexes Q1 to Q4 as shown in FIG. 13A.

On the other hand, for edge graphics 82 of the slanted wiring in FIG. 12B, information indicating inside and outside of the graphics is added to the coordinates of adjacent vertexes and the edges connecting two (2) vertexes, like the slanted wiring edge data 87 of the slanted wiring graphics 84 of FIG. 13B.

For example, taking the edge with the stat point Q1 and the end point Q2 as an example, inside of the graphic is a direction of 225 degrees in the two-dimensional coordinate system, or a direction toward lower left, on the other hand, a direction toward outside of the graphic is a direction of 45 degrees, or a direction toward upper right.

Although, in the vertical and horizontal wiring edge data 77 of FIG. 11B and the slanted wiring edge data 87 of FIG. 13B, inside and outside of the graphic are indicated by degrees of the angle in the two-dimensional coordinate system of the wiring graphic, the information is not limited to this, and any information indicating inside and outside of the graphic may be used.

FIG. 14A to 14C are schematic diagrams of a scaling process for eliminating wiring graphics less than the wiring width reference value a1 by the process of step S2 of FIG. 5 in the case that the first layer vertical and horizontal wiring interval reference 62-1 in the design rules 58 of FIGS. 4A and 4B is applied.

FIG. 14A is overall wiring graphics before the process, in which wiring graphics 96, 98 and 100 are arranged. The wiring graphics 96 and 98 of these are not greater than the wiring width reference value a1 in the first layer vertical and horizontal wiring interval reference 62-1 of FIGS. 4A and 4B, and as opposed to this, the wiring graphic 100 has a wiring width greater than a1 and not greater than a2.

At this point, in order to eliminate the wiring graphics 96 and 98 less than the reference value a1 and leaving the larger wiring graphic 100, a reduction process is executed for the overall wiring graphics 90. In this reduction process, as shown in reduction-processed graphics of FIG. 15B, the reduction process is executed to move vertex coordinates in the wiring graphics 96, 98 and 100 toward inside for a half value (a½) of the wiring width reference value a1. By this reduction process, graphics disappear for the wiring graphics 96 and 98, and a reduction-processed graphic 102 remains for the wiring graphic 100.

Subsequently, as shown in an enlargement-processed graphic 94 of FIG. 14C, adversely for the remaining reduction-processed graphic 102, by executing an enlargement process to move vertex coordinates toward outside for the same value (a½) as the value to reduce, the original wiring graphic 100 is generated, and the wiring graphic are extracted in the enlargement-processed graphic 94, in which the wiring graphics 96 and 98 less than the wiring reference width a1 are eliminated.

From the enlargement-processed graphic 94 generated with this scaling process, by further executing the reduction process using a half (a2/2) of the next greater wiring reference width a2 and the enlargement process to the remaining graphics after reduction, it is possible to extract the wiring graphics greater than the wiring reference width a2.

In this way, the wiring graphics to be the verification targets may be classified into three (3) wiring width ranges which are wiring graphics with the wiring width not greater than a1, graphics with the wiring width greater than a1 and not greater than a2 and graphics with the wiring width greater than a2, according to the first layer vertical and horizontal wiring interval reference 62-1 of FIG. 1, for example.

Although in FIG. 14A to 14C, classification of the vertical and horizontal wiring graphics according to the wiring width by the scaling process is taken as an example, it is also possible to classify the slanted wiring graphics into three (3) types which are graphics with the wiring width less than A1, graphics with the wiring width greater than A1 and not greater than A2 and graphics with the wiring width greater than A2 by executing similar scaling process based on the slanted wiring reference widths A1 and A2 in the first layer slanted wiring interval reference 64-1 of FIGS. 4A and 4B.

Figure 16A:
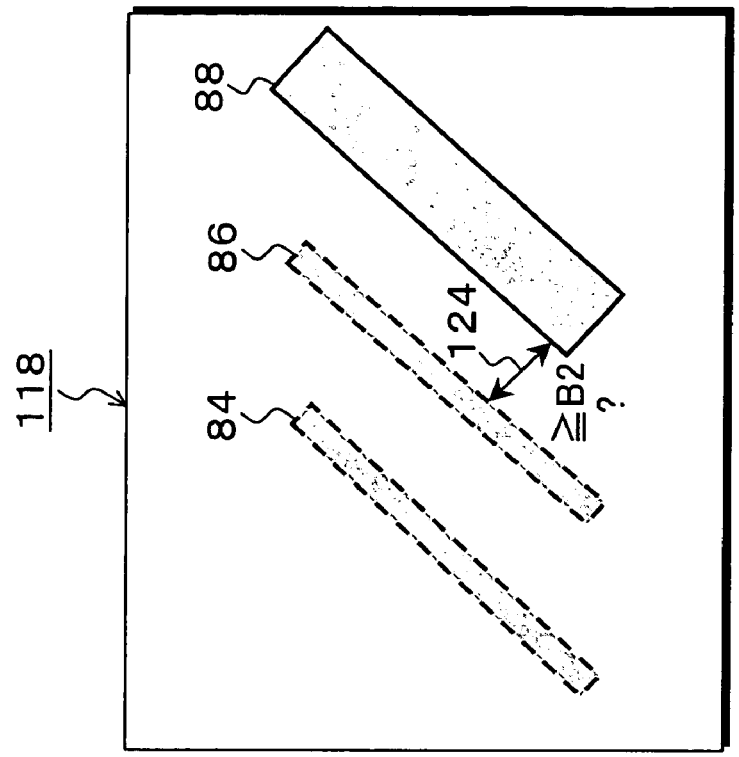
FIGS. 16A to 16B are schematic diagrams of slanted wiring interval verification targeting graphics with wiring width not greater than A1 and graphics with wiring width ranging From A1 to A2.
Figure 16B:
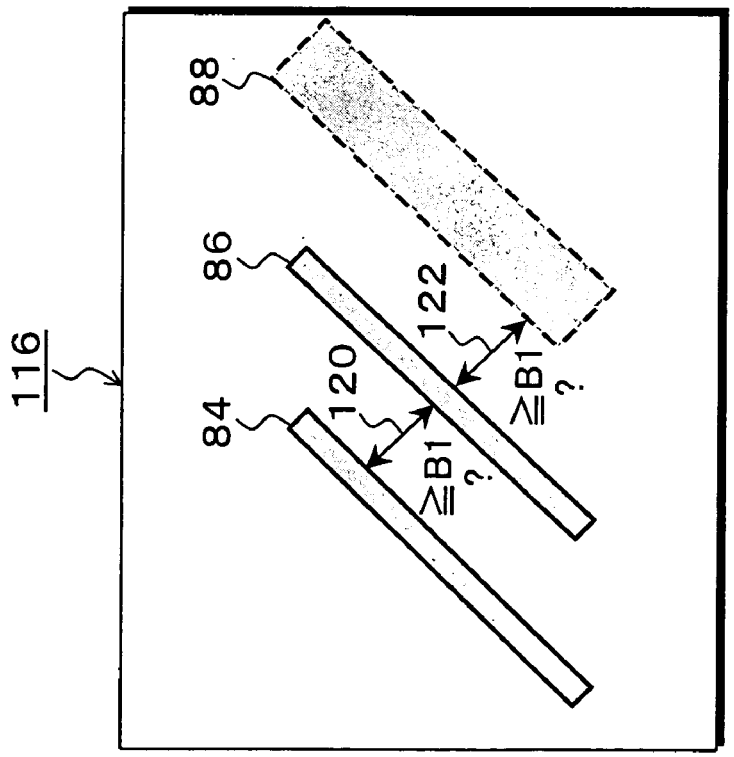

FIGS. 16A to 16B are schematic diagrams of extraction of vertical and horizontal wiring edges which contact with the wiring graphics classified into each wiring width range in step S3 of FIG. 5 and a verification process of the wiring intervals based on the extraction results thereof.

Figure 15A:
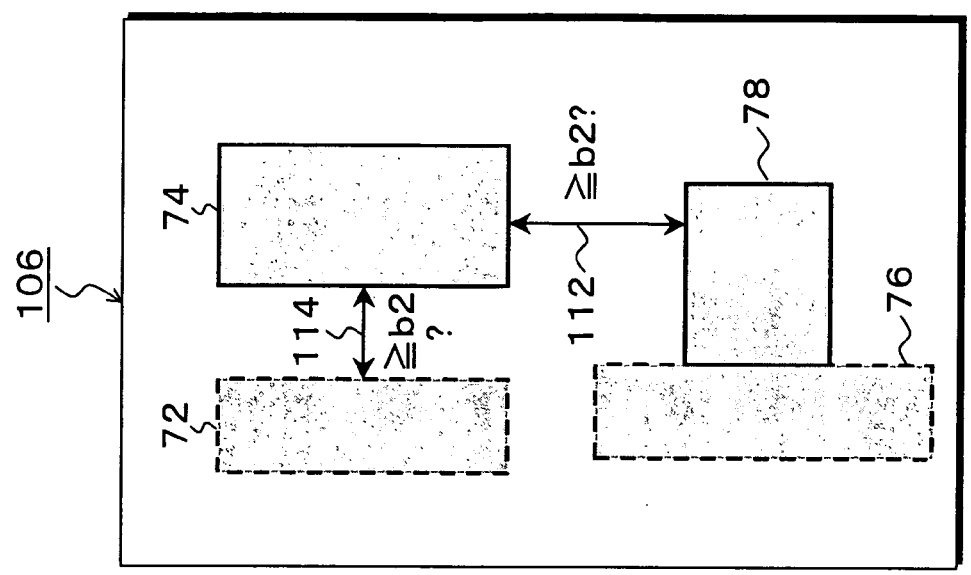
FIGS. 15A and 15B are schematic diagrams of vertical and horizontal wiring interval verification targeting graphics with wiring width not greater than a1 and graphics with wiring width ranging from a1 to a2.
Figure 15B:
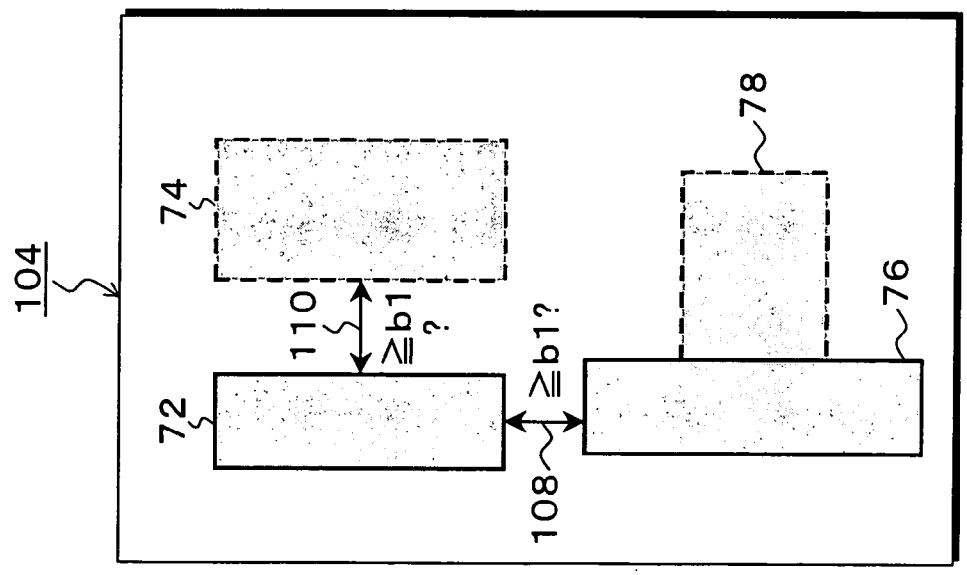

In FIG. 15A, wiring graphics 104 not greater than a1 are considered to be verification targets of the wiring intervals, and vertical and horizontal wiring graphics 72 and 76 are extracted as the graphics which contact with the vertical and horizontal wiring edges extracted in step S1.

Subsequently, it is verified whether a wiring interval 108 from the extracted vertical and horizontal wiring graphics 72 and 76 to the opposed edge satisfies the design condition, which is not less than the interval reference value b1, or not. If the wiring interval 108 is less than the interval reference value b1, then the wiring interval error is acknowledged and the error output is executed.

Also verified are the wiring intervals to the edges of other vertical and horizontal wiring graphics 74 and 78 which belong to wiring width ranges other than that of the vertical and horizontal wiring graphics 72 and 76. In this example, the vertical and horizontal wiring graphic 72 is opposed to the edge of the vertical and horizontal wiring graphic 74, therefore a wiring interval 110 is verified according to the interval reference value b1.

FIG. 16 is the interval verification targeting the graphics with the wiring width ranging from a1 to a2 by means of the interval reference b2. In these graphics with the wiring width ranging from a1 to a2 106, vertical and horizontal wiring graphics 74 and 78 are classified as the graphics belonging to the wiring width range, therefore a wiring interval 112 for the opposed edges of the vertical and horizontal wiring graphics 74 and 78 is verified according to the interval reference value b2.

Also, interval verification is performed for other vertical and horizontal wiring graphics 72 and 76 which do not belong to the wiring width range of the vertical and horizontal wiring graphics 74 and 78. In this example, a wiring interval 114 to the edge of the wiring graphics 72 which is opposed to the edge of the wiring graphic 74 is verified.

FIGS. 16A to 16B are schematic diagrams of the slanted wiring interval verification process targeting the slanted wiring graphics. FIG. 17A is verification of the wiring intervals of graphics with the wiring width not greater than A1, and since wiring graphics 84 and 86 belong to the wiring width range not greater than A1, a wiring interval between opposed edges of both graphics are verified according to the interval reference value B1 for the slanted wiring.

Also, for the interval from the opposed edge of a slanted wiring graphic 88 which does not belong to the wiring width range, a wiring interval 122 to a slanted wiring graphic 86 is verified according to the interval reference value B1 for the slanted wiring.

FIG. 17B is a verification process for the wiring intervals of the slanted wiring in graphics with the wiring width ranging from A1 to A2 118. In this example, for the slanted wiring graphic 88 which belongs to the range of wiring width from A1 to A2, a wiring interval 124 to the opposed edge of the slanted wiring graphic 86 which belongs to other wiring width range is verified according to the interval reference value B2 for the slanted wiring.

For specific wiring graphics 68 of FIG. 6 and the vertical and horizontal wiring edge extraction graphics 69 of FIG. 7 extracted from these and the slanted wiring edge extraction graphics 62, those basic verification processes of the wiring intervals according to the wiring interval verification process of FIG. 5 are specifically described as follows.

Figure 17:
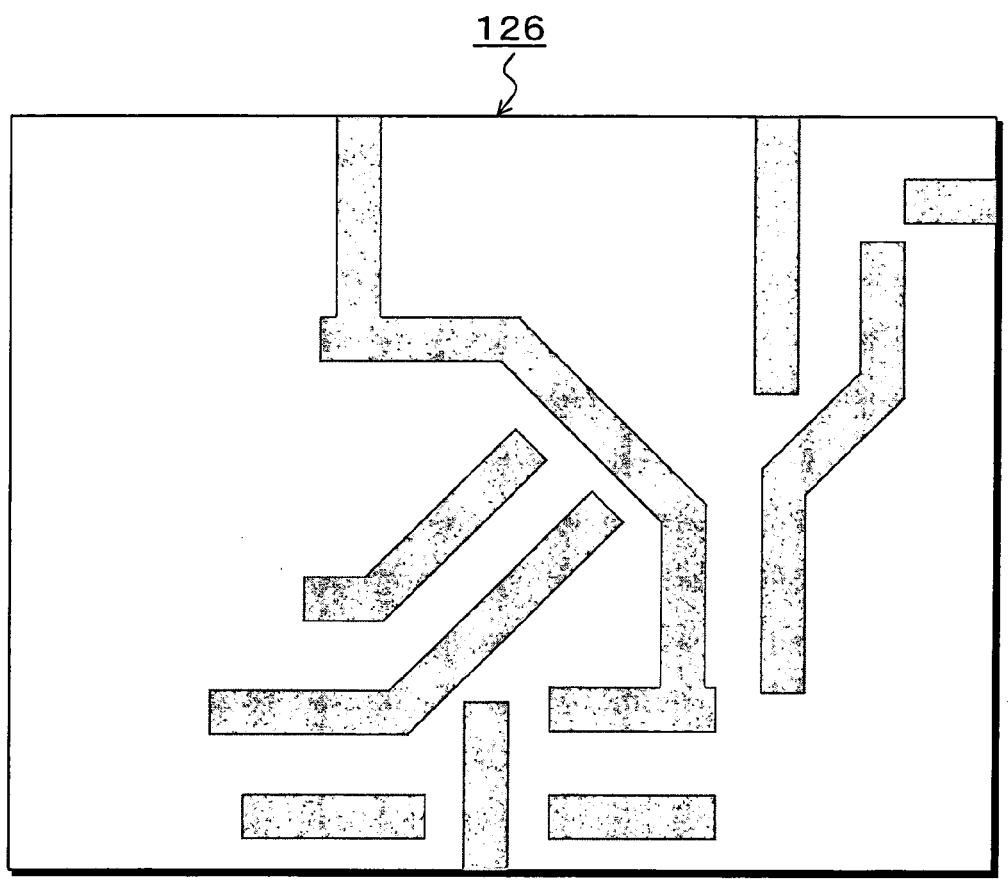
FIG. 17 is a schematic diagram of graphics with wiring width not greater than a1 extracted from the overall wiring graphics of FIG. 6.

FIG. 17 is graphics with the wiring width not greater than a1 126 generated by executing the scaling process to the wiring graphics 68 of FIG. 6 using the reference wiring width a1, and FIG. 16 is graphics with the wiring width ranging from a1 to a2 128 generated by the same scaling process.

Figure 18:
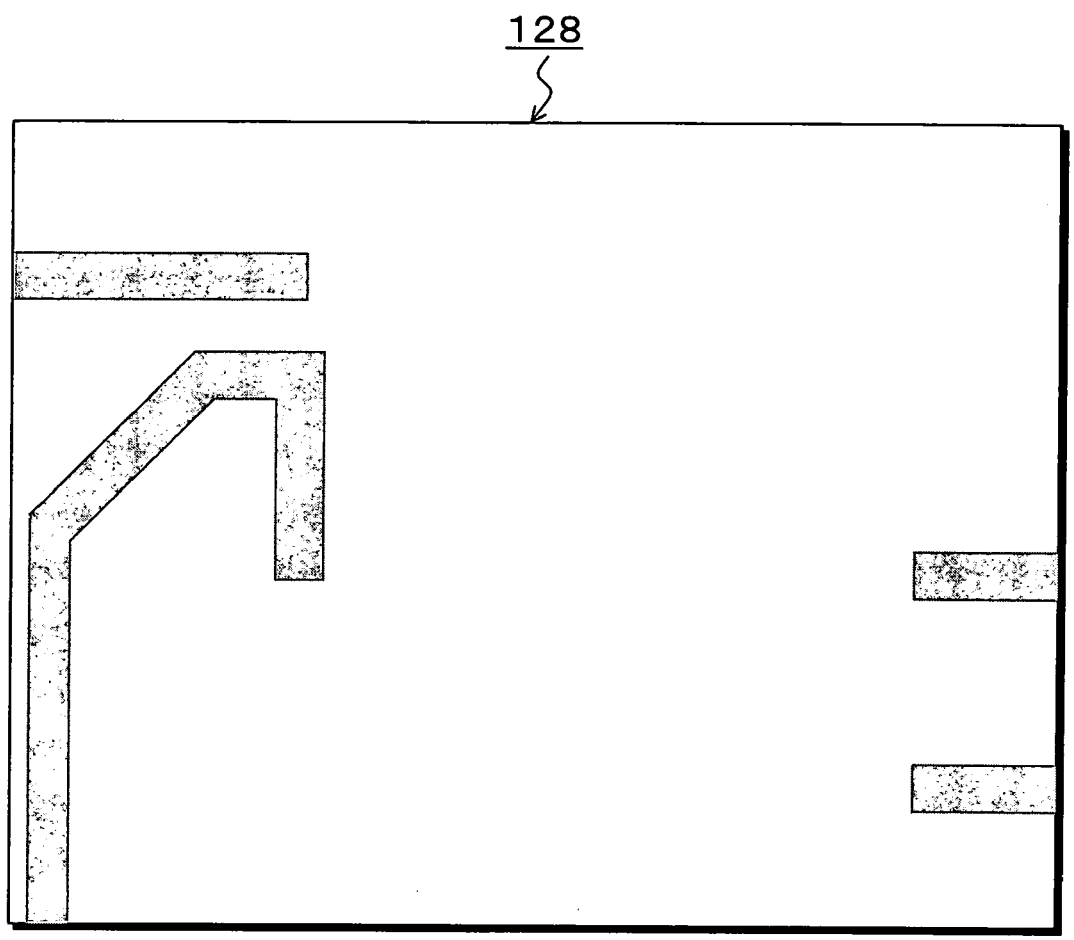
FIG. 18 is a schematic diagram of graphics with wiring width ranging from a1 to a2 extracted from the overall wiring graphics of FIG. 6.

Specifically, since the graphics with the wiring width ranging from a1 to a2 128 of FIG. 18 is obtained from the scaling process using the reference wiring width a1, the graphics with the wiring width not greater than a1 126 of FIG. 17 may be obtained by eliminating these from the wiring graphics 68 of FIG. 6.

Figure 19:
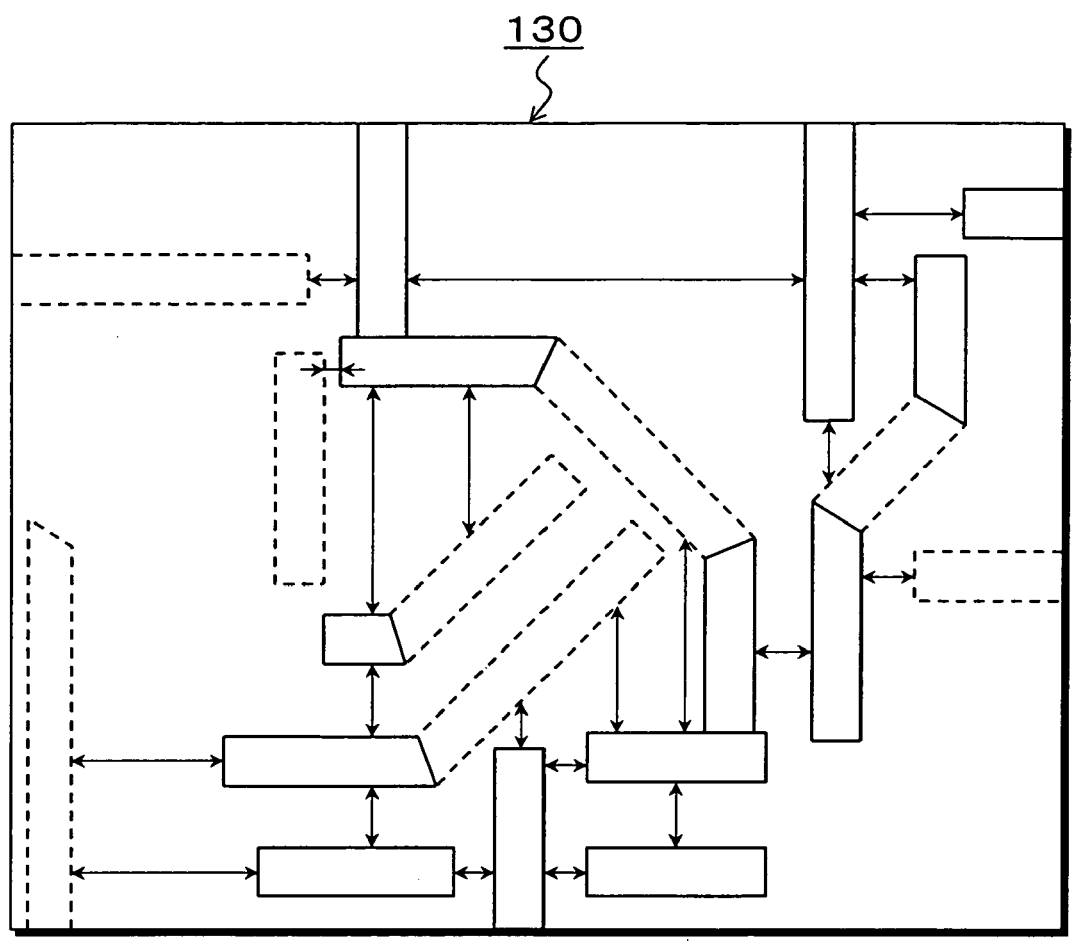
FIG. 19 is a schematic diagram of b1 interval verification graphics targeting vertical and horizontal wiring graphics with wiring width not greater than a1.

FIG. 19 is b1 interval verification graphics 130 showing the wiring interval verification for the graphics with the wiring width not greater than a1 126 of FIG. 17 using the reference interval b1, and the verification according to the reference value b1 is performed for the wiring intervals, which are indicated by arrows, between the extracted edge graphics illustrated by solid lines and the counterpart edges opposed to these.

Figure 20:
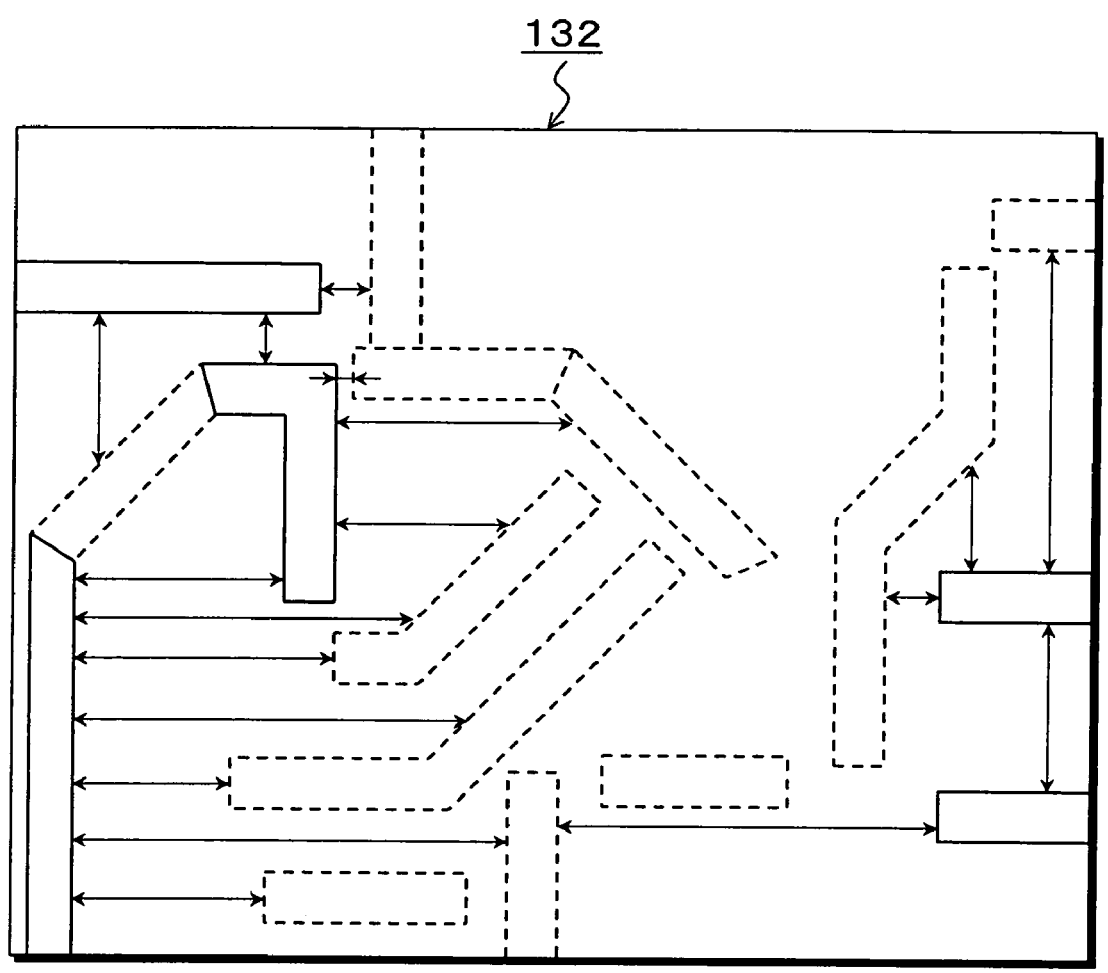
FIG. 20 is a schematic diagram of b2 interval verification graphics targeting vertical and horizontal wiring graphics with wiring width ranging from a1 to a2.

FIG. 20 is b2 interval verification graphics 132 showing the interval verification targeting the graphics with the wiring width ranging from a1 to a2 128 of FIG. 18 using the reference interval b2, and the verification according to the reference value b2 is performed for the wiring intervals, which are indicated by arrows, between the extracted edge graphics illustrated by solid lines and the counterpart edges opposed to these.

Figure 21:
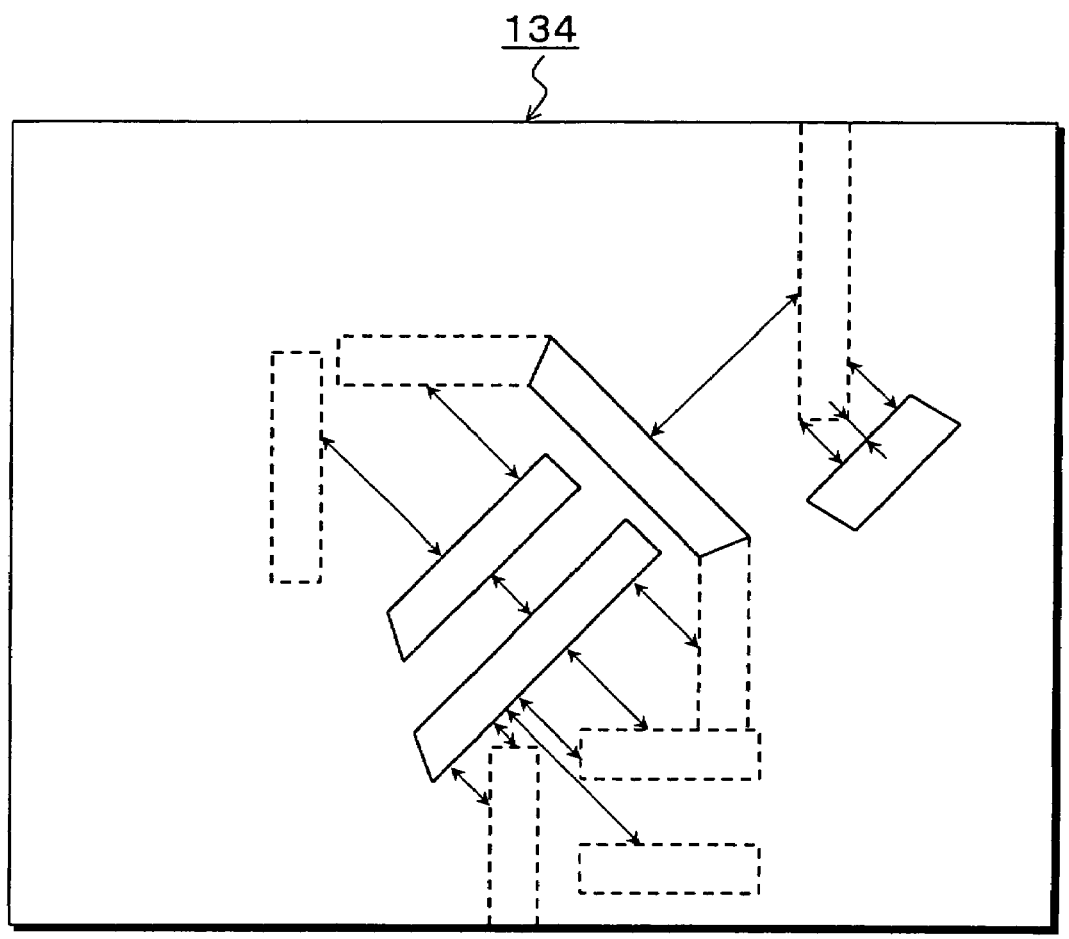
FIG. 21 is a schematic diagram of B1 interval verification graphics targeting slanted wiring graphics with wiring width not greater than A1.

Also, for the interval verification of the slanted wiring, by extracting graphics of the edges which contact with the slanted wiring edge extraction graphics 70 of FIG. 8 from the graphics with the wiring width not greater than a1 126 of FIG. 17, the b1 interval verification graphics 134 of FIG. 21 are generated, and the wiring intervals between edges, which are indicated by arrows, are verified using the reference interval b1 for the slanted wiring.

Figure 22:
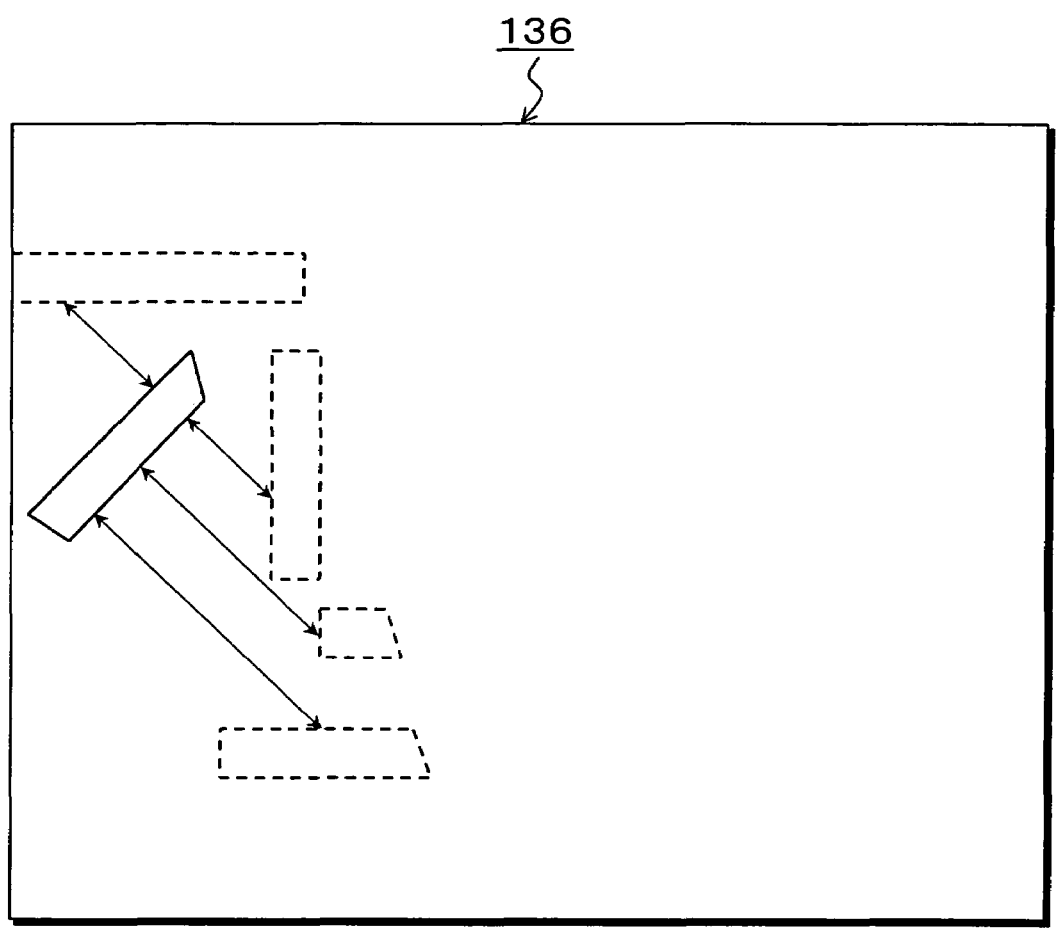
FIG. 22 is a schematic diagram of B2 interval verification graphics targeting slanted wiring graphics with wiring width ranging from A1 to A2.

Also, for the graphics with the wiring width ranging from a1 to a2 128 of FIG. 18, by extracting graphics which contact with edges using the slanted wiring edge extraction graphics 62 of FIG. 8, the B2 interval verification graphics 136 of FIG. 22 are generated, and the wiring intervals between edges, which are indicated by arrows, are verified using the reference interval B2 for the slanted wiring.

Although, in the interval verification process of FIG. 17 to FIG. 22, the wiring intervals are verified by classifying the wiring graphics into two (2) wiring width ranges according to the reference wiring widths a1 and a2 of the vertical and horizontal wiring and extracting graphics which contact with the vertical and horizontal wiring edges and the slanted wiring edges, it may be possible to verify the wiring intervals of the slanted wiring by performing the classification according to the slanted reference wiring width A1 and A2 as the classification of the slanted wiring into the wiring width ranges and then extracting graphics which contact with the slanted wiring edges.

Figure 23A:
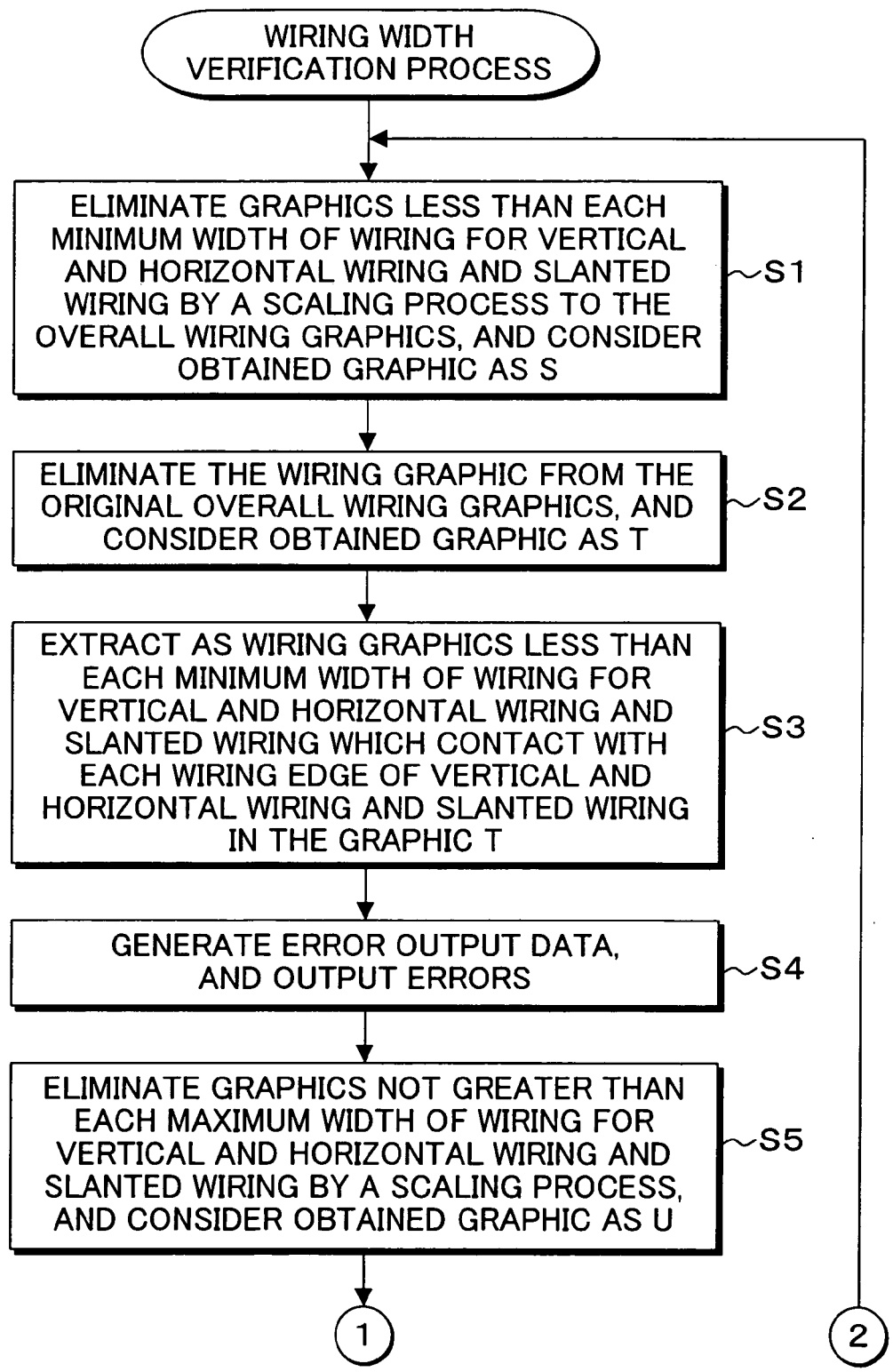
FIGS. 23A and 23B are flowcharts of a wiring width verification process according to the invention.
Figure 23B:
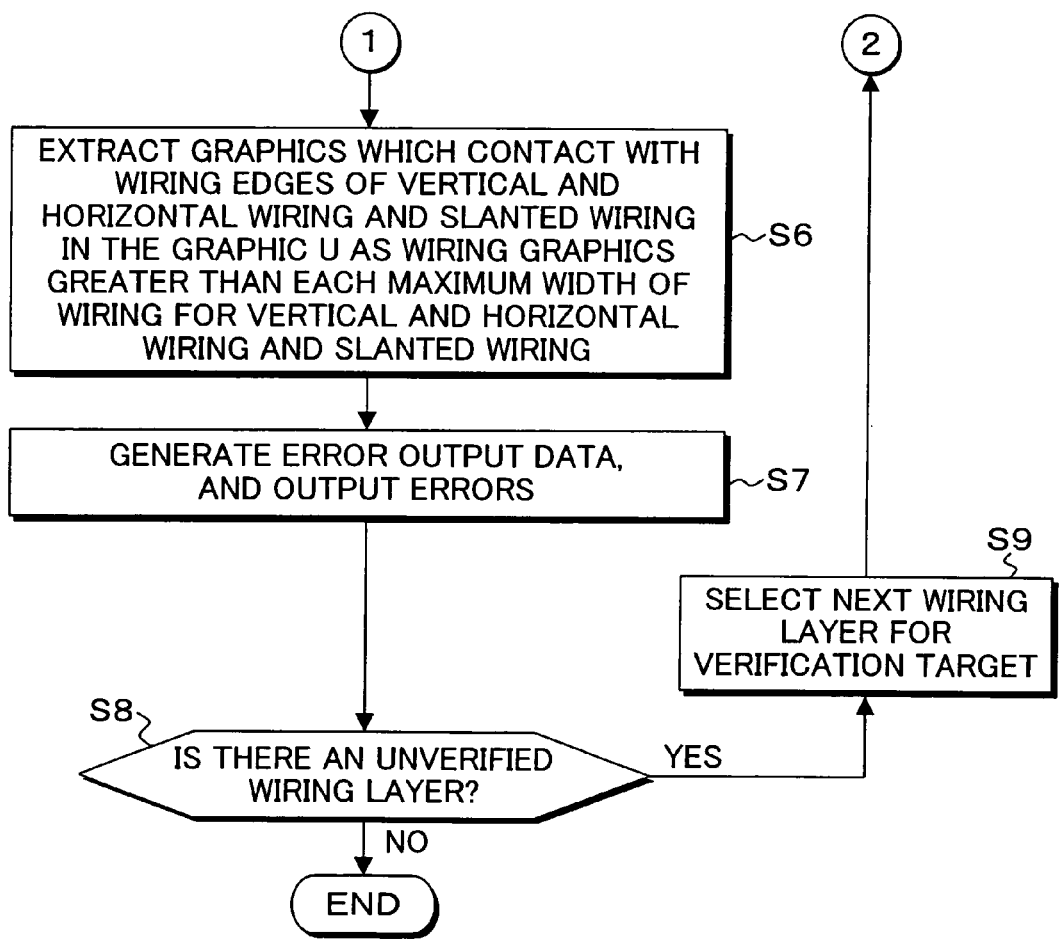

FIGS. 23A and 23B are flowcharts of the wiring width verification process according to the invention. Since this wiring width verification process is executed after the wiring width verification process of FIG. 5 is executed, it is possible to utilize the information of the vertical and horizontal wiring edges and the slanted edges extracted in step S1 of the wiring width verification process, therefore that process will not be executed. This wiring width verification process is as follows.

Figure 24:
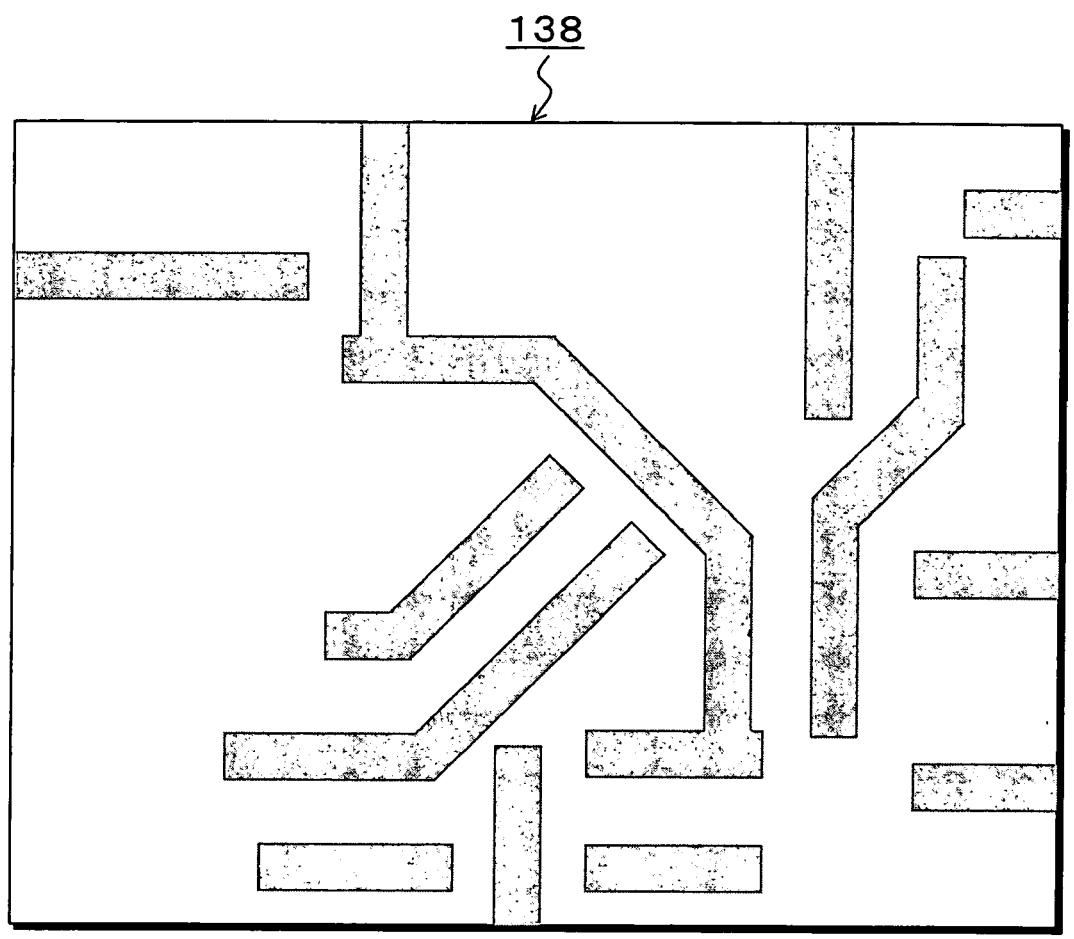
FIG. 24 is a schematic diagram of a scaled S graphic in which wiring graphics less than minimum width of wiring are eliminated by a scaling process to wiring graphics of FIG. 6.

Step S1:

Eliminate graphics less than each minimum width of wiring for the vertical and horizontal wiring and the slanted wiring by the scaling process to the overall wiring graphics, and consider obtained graphic as S. For example, for the wiring graphics 68 of FIG. 6, when graphics less than the minimum width of wiring is eliminated by the scaling process, scaled S graphics 138 shown in FIG. 24 are obtained.

Figure 25:
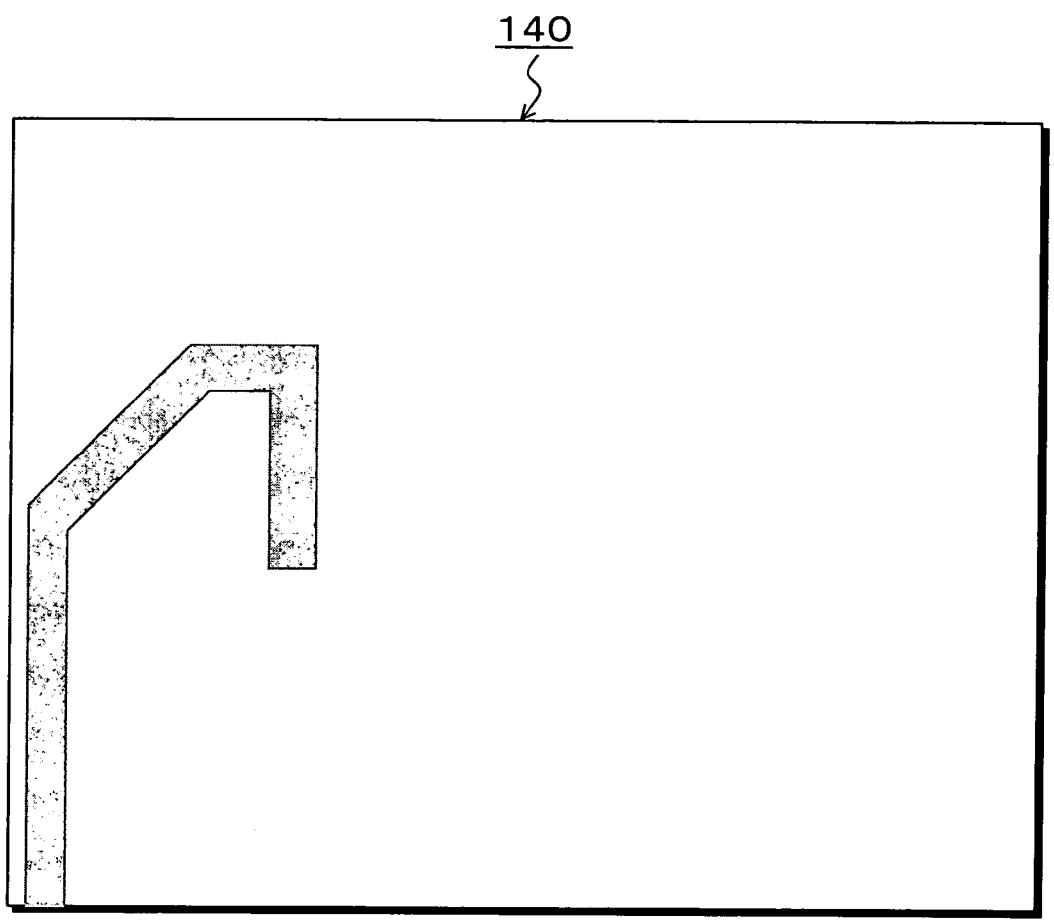
FIG. 25 is a schematic diagram of extracted T graphics obtained by eliminating scaled S graphics of FIG. 24 from overall wiring graphics of FIG. 6.

Step S2:

Eliminate the wiring graphic S obtained in step S1 from the original overall wiring graphics, and consider obtained graphics as T. For example, when the scaled S graphics 138 of FIG. 24 are eliminated from the original wiring graphics 68 of FIG. 6, extracted T graphics 140 of FIG. 25 are obtained.

Figure 26:
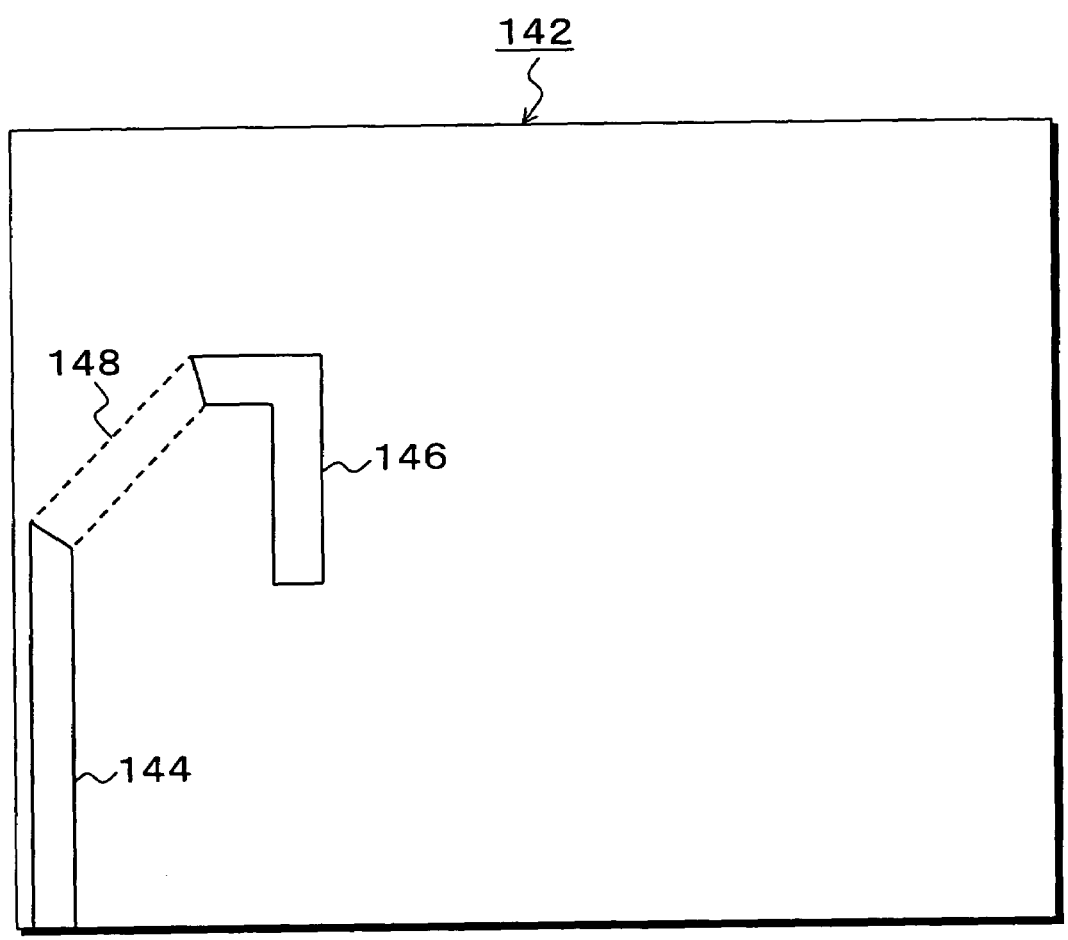
FIG. 26 is a schematic diagram of graphics less than minimum width in which vertical and horizontal wiring contacting with vertical and horizontal wiring edges of FIG. 8 are extracted from extracted T graphics of FIG. 25.

Step S3:

Extract graphics which contact with each wiring edge of the vertical and horizontal wiring extracted in step S1 of FIG. 5 out of the graphics T as the wiring graphics less than each minimum width of wiring for the vertical and horizontal wiring and the slanted wiring. For example, for the extracted T graphics 140 of FIG. 25, when the graphics which contact with the edges are extracted using the vertical and horizontal wiring edge extraction graphics 60 of FIG. 7, vertical and horizontal wiring graphics 144 and 146 in the graphics less than minimum width 142 of FIG. 26 are extracted. Also, for the extracted T graphics 140 of FIG. 25, when the graphics which contact with the edges of the slanted wiring edges extraction graphics 62 of FIG. 8 are extracted, a slanted wiring graphic 148 in the graphics less than minimum width 142 of FIG. 26 is extracted.

Step S4:

If graphics less than minimum width of wiring for the vertical and horizontal wiring and the slanted wiring are extracted in step S3, generate error output data and output errors.

Figure 27:
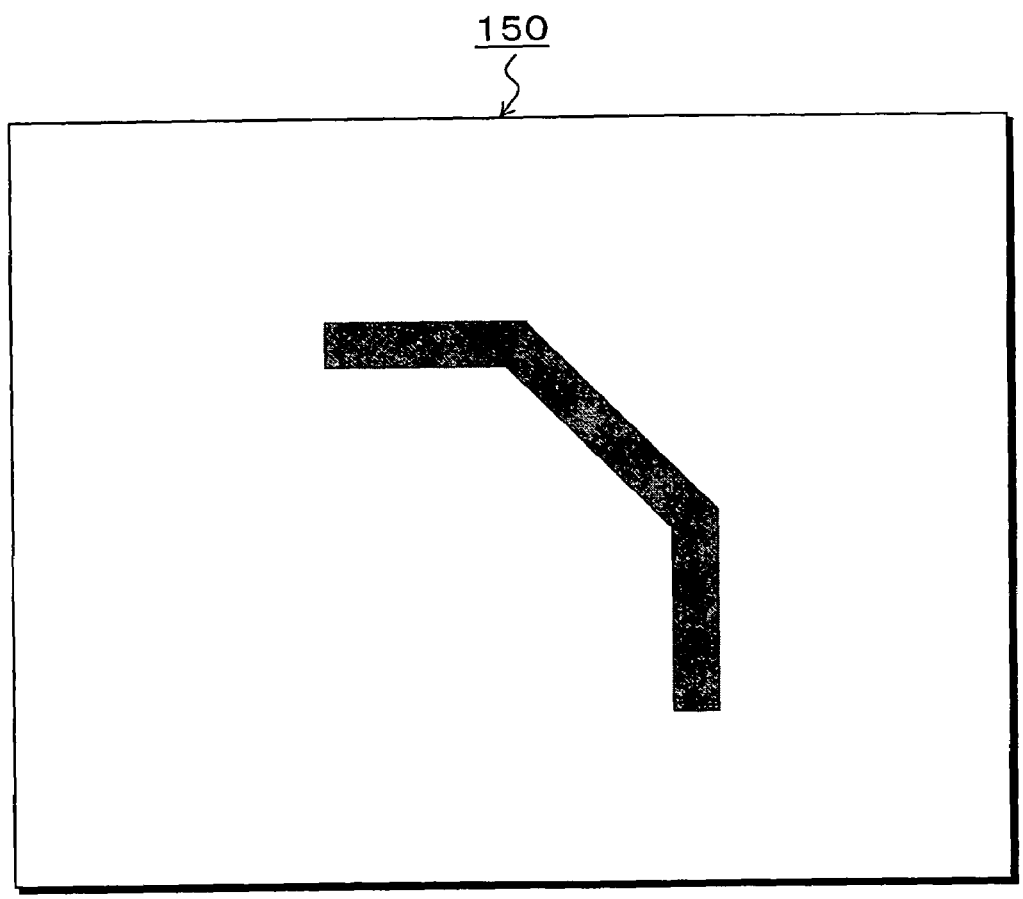
FIG. 27 is a schematic diagram of scaled U graphics greater than maximum width of wiring extracted by a scaling process to wiring graphics of FIG. 6.

Step S5:

Eliminate graphics not greater than each maximum width of wiring for the vertical and horizontal wiring and the slanted wiring by the scaling process, and consider obtained graphics as U. For example, for the wiring graphics of FIG. 6, when the graphics not greater than the maximum widths is eliminated by the scaling process, scaled U graphics 150 of FIG. 27 are obtained, for example.

Figure 28:
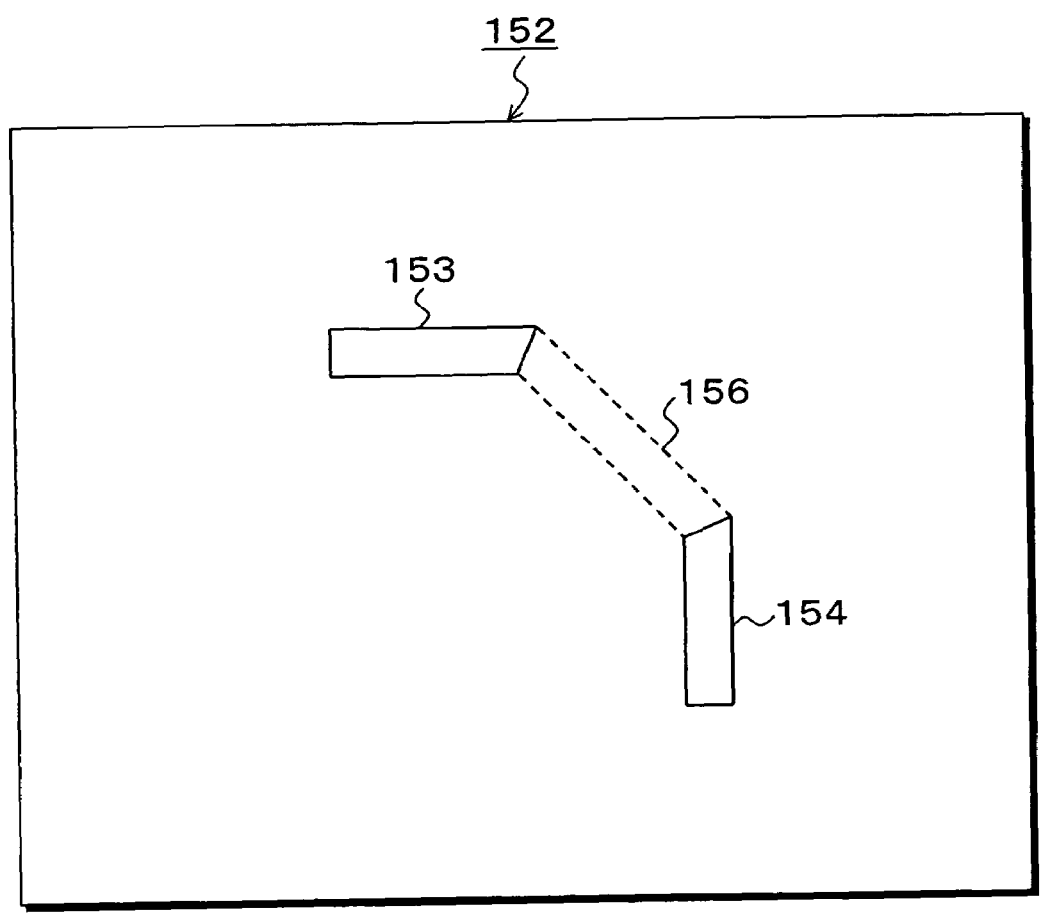
FIG. 28 is a schematic diagram of maximum width over graphics in which vertical and horizontal wiring contacting with vertical and horizontal wiring edges of FIG. 8 are extracted from a scaled U graphic of FIG. 27.

Step S6:

Extract graphics which contact with wiring edges of the vertical and horizontal wiring and the slanted wiring in the graphics U as the wiring graphics greater than each maximum width of wiring for the vertical and horizontal wiring and the slanted wiring. For example, from the scaled U graphics of FIG. 27, vertical and horizontal wiring graphics 153 and 154 are extracted as the graphics which contact with the vertical and horizontal wiring edges, as shown in maximum width over graphics 152 of FIG. 28, and also, slanted wiring graphics 156 are extracted as the graphics which contact with the slanted wiring edges.

Step S7:

If the vertical and horizontal and/or the slanted wiring graphics greater than the maximum width of wiring are extracted in step S6, generate error output data and output errors.

Step S8:

Checks whether there is an unverified wiring layer or not, and if there is, then proceed to step S9, and if there is not, terminate the process.

Step S9:

Select next wiring layer for the verification target and back to step S1.

Figure 29:
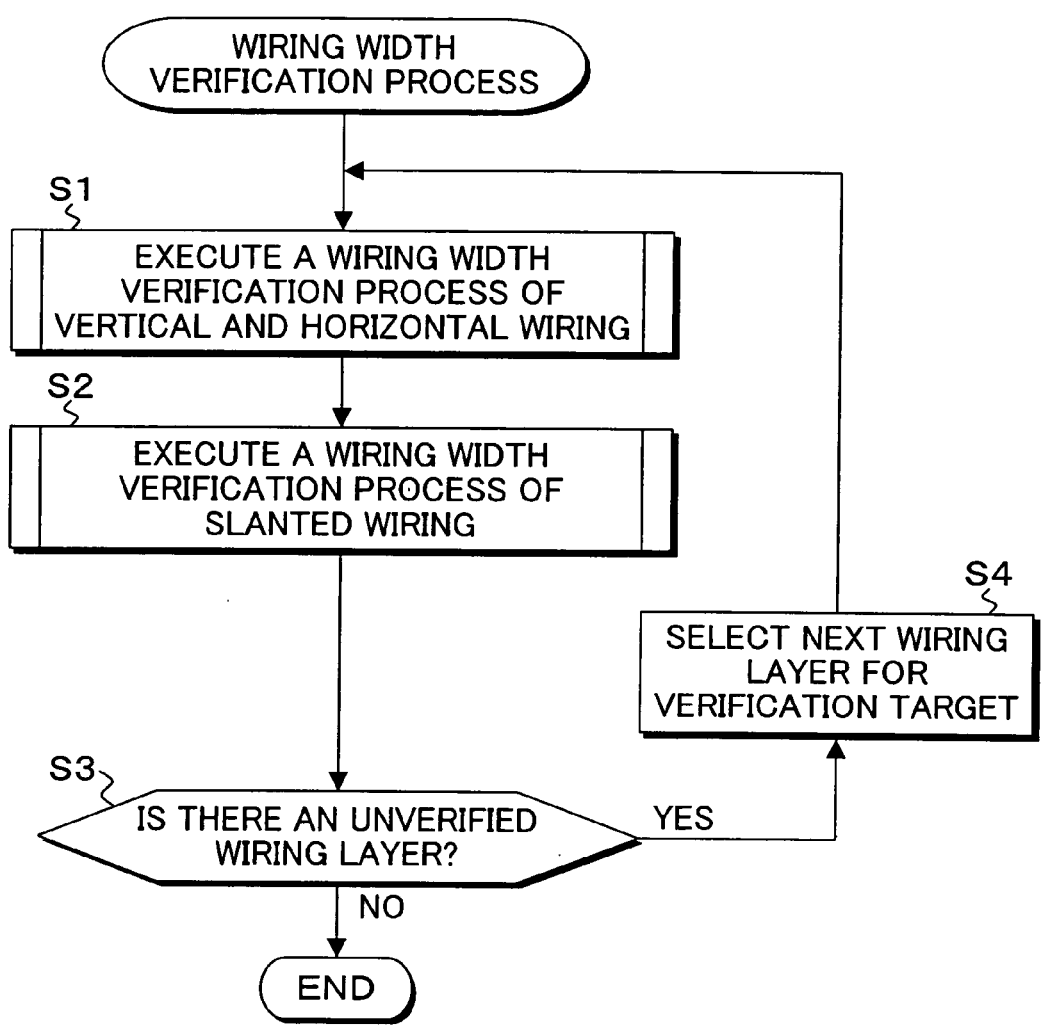
FIG. 29 is a flowchart of another embodiment of a wiring width verification process according to the invention.

At this point, in the wiring width verification process of FIGS. 23A and 23B, the wiring width verifications of the vertical and horizontal wiring graphics and the slanted wiring graphics are processed in parallel, but as shown in a flowchart of FIG. 29, after executing the wiring width verification process of the vertical and horizontal wiring in step S1 and then executing the wiring width verification process of the slanted wiring in step S2, it may be possible to repeat the process for selecting the wiring layer for the verification target sequentially in step S4 until the unverified wiring layer will not exist in step S3.

Figure 30:
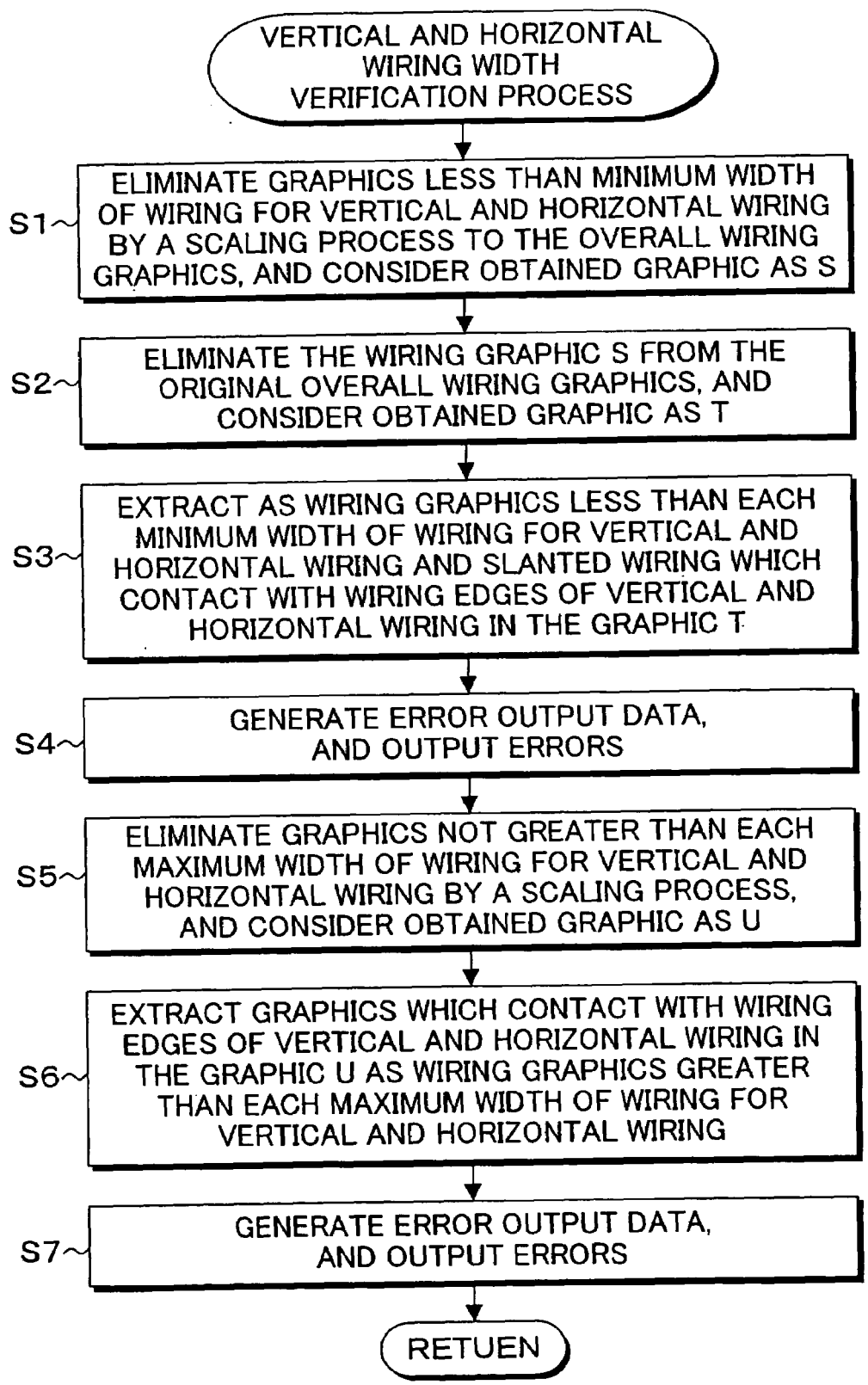
FIG. 30 is a flowchart of a wiring width verification process of vertical and horizontal wiring in FIG. 29.

The wiring width verification process of the vertical and horizontal wiring in step S1 of FIG. 29 may be shown as a flowchart of FIG. 30. The wiring width verification process of FIG. 30 is steps S1 to S7 of FIGS. 23A and 23B from which the process for the slanted wiring is removed such that only the process for the vertical and horizontal wiring is remained.

Figure 31:
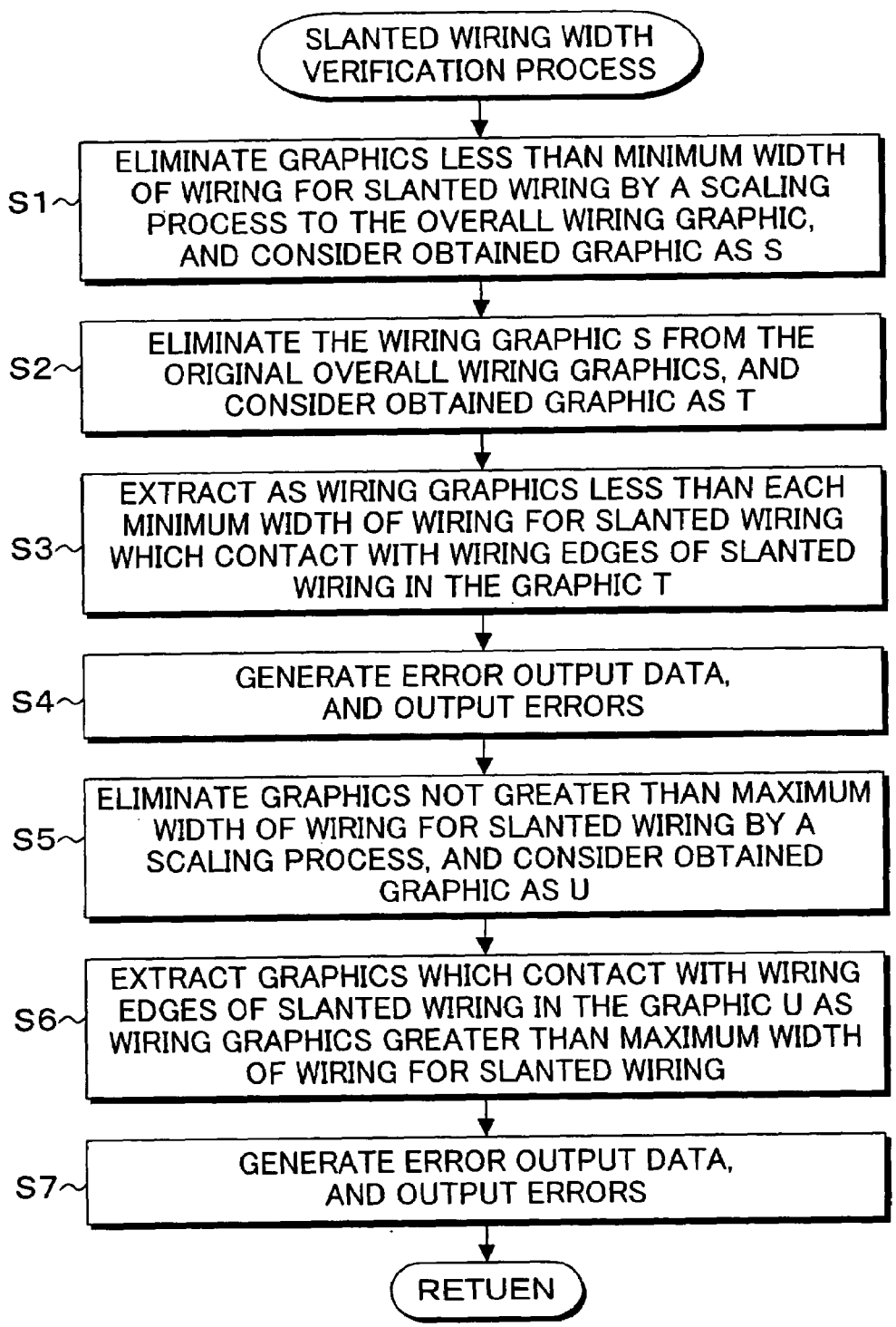
FIG. 31 is a flowchart of a wiring width verification process of slanted wiring in FIG. 29.

Also, the wiring width verification process of the slanted wiring in step S2 of FIG. 29 may be shown as steps S1 to S7 of FIG. 31. This process also is steps S1 to S7 of FIGS. 23A and 23B from which the process for the vertical and horizontal wiring is removed such that only the process for the slanted wiring is remained.

Although, in above embodiments, the wiring width verification process is executed after executing the wiring interval verification process first, the wiring interval verification process may be executed after executing the wiring width verification process first, or both may be executed in parallel. In either case, it is needed to execute the edge extraction process for extracting the vertical and horizontal wiring edges and the slanted wiring edges from the overall wiring graphics in the first step of the process.

Also, in above embodiments, the large scale semiconductor integrated circuits design is taken as example, but the invention may be applied to the circuit design of any semiconductor integrated circuits regardless of the scale and may be applied directly to the circuit design of printed circuit boards.

Further, the present invention covers any alterations without impairing the object and the benefit thereof but is not limited by the numeric values indicated in the above embodiments.

According to the invention as set forth hereinabove, in a layout pattern in which vertical and horizontal wiring and slanted wiring are mixed, if design bases of the vertical and horizontal wiring and the slanted wiring are different respectively and even if wiring interval reference values and wiring width reference values as the design bases are different, it is possible to verify wiring graphics in which the vertical and horizontal wiring and the slanted wiring are mixed in block, and as a result, it is possible to make the vertical and horizontal wirings and the slanted wirings as well as the vertical and horizontal wiring and the slanted wiring closer until reaching to allowable limits based on design rules. Consequently, it is possible to make a contribution to cut-down of wiring lengths, control of wiring delays and reduction of chip areas, and to make a great contribution to improvement of performance.

What is claimed is:

1. A computer-aided wiring graphic verification method for verifying wiring intervals in wiring graphic data for wiring masks including vertical and horizontal wiring and slanted wiring created from layout data for a circuit design, the method comprising:

an edge extraction step, by an edge extraction unit, extracting vertical and horizontal wiring edges and slanted wiring edges from overall wiring graphics;

a wiring width classification step, by a wiring width classification unit, executing a scaling process for the overall wiring graphics and classifying the wiring graphics into wiring width ranges which are divided by a predefined reference wiring width;

a vertical and horizontal wiring edge extraction step, by a vertical and horizontal wiring edge extraction unit, extracting the vertical and horizontal wiring edges which are in contact with graphics classified into the wiring width ranges;

a vertical and horizontal wiring interval verification step, by a vertical and horizontal wiring interval verification unit, verifying intervals between the vertical and horizontal wiring edges and opposed edges to be verification counterparts based on a vertical and horizontal reference interval for each wiring width range;

a slanted wiring edge extraction step, by a slanted wiring edge extraction unit, extracting slanted wiring edges which are in contact with graphics classified into the wiring width ranges; and a slanted wiring interval verification step, by a slanted wiring interval verification unit, verifying intervals between the slanted wiring edges and opposed edges to be verification counterparts based on a slanted reference interval for each wiring width range.

2. The wiring graphic verification method according to claim 1, wherein the wiring width classification step includes setting one or more reference wiring widths for defining the wiring width ranges for each of the vertical and horizontal wiring and the slanted wiring.

3. The wiring graphic verification method according to claim 1, wherein the wiring width classification step includes, if a single reference wiring width is set for defining the wiring width ranges, executing a reduction process for the overall wiring graphics which moves vertex coordinates toward inside of the graphic by one-half of the reference width to disappear wiring graphics not greater than the reference wiring width, and thereafter executing an enlargement process which moves vertex coordinates of remaining wiring graphics toward outside of the graphic by one-half of the reference wiring width, to thereby perform classification into the wiring graphics not greater than the reference wiring width and the wiring graphics greater than the reference wiring width.

4. The wiring graphic verification method according to claim 1, wherein the wiring width classification step includes, if a plurality of reference wiring widths are set for defining the wiring width ranges, selecting the reference wiring width in ascending order or descending order, and repeating the process which includes, executing a reduction process for the wiring graphics which moves vertex coordinates toward inside of the graphic by one-half of the selected reference wiring width to disappear wiring graphics not greater than the reference value, and thereafter executing an enlargement process which moves vertex coordinates of remaining graphics toward outside of the graphic by one-half of the reference wiring width, to thereby perform classification into the wiring graphics not greater than the reference wiring width and the wiring graphics greater than the reference wiring width.

5. The wiring graphic verification method according to claim 1, wherein the vertical and horizontal wiring width verification step includes verifying whether or not the wiring intervals to the edges of vertical and horizontal wiring graphics opposed to the vertical and horizontal wiring edges violate the reference interval of the vertical and horizontal wiring.

6. The wiring graphic verification method according to claim 5, wherein the slanted wiring width verification step includes verifying whether or not the wiring intervals to the edges of slanted wiring graphics which are located in orthogonal direction to the vertical and horizontal wiring edges toward outside of the graphics violate the reference interval of the vertical and horizontal wiring.

7. The wiring graphic verification method according to claim 1, wherein the slanted wiring width verification step includes verifying whether or not the wiring intervals to the edges of slanted wiring graphics opposed to the slanted wiring edges violate the reference interval of the slanted wiring.

8. The wiring graphic verification method according to claim 7, wherein the slanted wiring width verification step includes verifying whether or not the wiring intervals to the edges of vertical and horizontal wiring graphics which are located in orthogonal direction to the slanted wiring edges violate the reference interval of the slanted wiring.

9. The wiring graphic verification method according to claim 1, wherein the slanted wiring graphics are arranged at a slant of 45 degrees relative to the vertical and horizontal directions.

10. The wiring graphic verification method according to claim 1, wherein each of the steps is processed sequentially for each wiring layer.

11. A computer-aided wiring graphic verification method for verifying wiring intervals and wiring widths in wiring graphic data for wiring masks including vertical and horizontal wiring and slanted wiring created from layout data for semiconductor integrated circuit designing, the method comprising:

an edge extraction step, by an edge extraction unit, extraction vertical and horizontal wiring edges and slanted wiring edges from overall wiring graphics;

a wiring width classification step, by a wiring width classification unit, executing a scaling process for the overall wiring graphics and classifying the wiring graphics into wiring width ranges which are divided by a predefined reference wiring width;

a vertical and horizontal wiring edge extraction step, by a vertical and horizontal wiring edge extraction unit, extracting the vertical and horizontal wiring edges which are in contact with graphics classified into the wiring width ranges;

a vertical and horizontal wiring interval verification step, by a vertical and horizontal wiring interval verification unit, verifying intervals between the vertical and horizontal wiring edges and opposed edges to be verification counterparts based on a vertical and horizontal reference interval for each wiring width range;

a slanted wiring edge extraction step, by a slanted wiring edge extraction unit, extracting slanted wiring edges which are in contact with graphics classified into the wiring width ranges;

a slanted wiring interval verification step, by a slanted wiring interval verification unit, verifying intervals between the slanted wiring edges and opposed edges to be verification counterparts based on a slanted reference interval for each wiring width range;

a minimum wiring width extraction step, by a minimum wiring width extraction unit, extracting wiring graphics less than a predefined minimum wiring width through a scaling process for the overall wiring graphics;

a minimum wiring width verification step, by a minimum wiring width verification unit, extracting vertical and horizontal wiring graphics which are in contact with the vertical and horizontal wiring edges and slanted wiring graphics which are in contact with the slanted wiring edges out of the wiring graphics less than the minimum width, and outputting minimum wiring with errors;

a maximum wiring width extraction step, by a maximum wiring width extraction unit, extraction wiring graphics greater than predefined maximum width through a scaling process for the overall wiring graphics; and a maximum wiring width verification step, by a maximum wiring width verification unit, extracting vertical and horizontal wiring graphics which are in contact with the vertical and horizontal wiring edges and slanted wiring graphics which are contact with the slanted wiring edges out of the wiring graphics greater than the maximum width, and outputting maximum wiring width errors.

12. A program stored on a computer readable storage for allowing a computer to execute:

an edge extraction step extracting vertical and horizontal wiring edges and slanted wiring edges from overall wiring graphics;

a wiring width classification step executing a scaling process for the overall wiring graphics and classifying the wiring graphics into wiring width ranges which are divided by a predefined reference wiring width;

a vertical and horizontal wiring edge extraction step extracting the vertical and horizontal wiring edges which are in contact with graphics classified into the wiring width ranges;

a vertical and horizontal wiring interval verification step verifying intervals between the vertical and horizontal wiring edges and opposed edges to be verification counterparts based on a vertical and horizontal reference interval for each wiring width range;

a slanted wiring edge extraction step extracting slanted wiring edges which are in contact with graphics classified into the wiring width ranges; and a slanted wiring interval verification step verifying intervals between the slanted wiring edges and opposed edges to be verification counterparts based on a slanted reference interval for each wiring width range.

13. A program stored on a computer readable storage for allowing a computer to execute:

an edge extraction step extracting vertical and horizontal wiring edges and slanted wiring edges from overall wiring graphics;

a wiring width classification step executing a scaling process for the overall wiring graphics and classifying the wiring graphics into wiring width ranges which are divided by a predefined reference wiring width;

a vertical and horizontal wiring edge extraction step extracting the vertical and horizontal wiring edges which are in contact with graphic classified into the wiring width ranges;

a vertical and horizontal wiring interval verification step verifying intervals between the vertical and horizontal wiring edges and opposed edges to be verification counterparts based on a vertical and horizontal reference interval for each wiring width range;

a slanted wiring edge extraction step extracting slanted wiring edges which are in contact with graphics classified into the wiring width ranges;

a slanted wiring interval verification step verifying intervals between the slanted wiring edges and opposed edges to be verification counterparts based on a slanted reference interval for each wiring width range;

a minimum wiring width extraction step extracting wiring graphics less than a predefined minimum wiring width through a scaling process for the overall wiring graphics;

a minimum wiring width verification step extracting vertical and horizontal wiring graphics which are in contact with the vertical and horizontal wiring edges and slanted wiring graphics which are in contact with the slanted wiring edges out of the wiring graphics less than the minimum width, and outputting minimum wiring width errors;

a maximum wiring width extraction step extracting wiring graphics greater than predefined maximum width through a scaling process for the overall wiring graphics; and a maximum wiring width verification step extracting vertical and horizontal wiring graphics which are in contact with the vertical and horizontal wiring edges and slanted wiring graphics which are contact with the slanted wiring edges out of the wiring graphics greater than the maximum width, and outputting maximum wiring width errors.

14. A computer-aided wiring graphic verification apparatus for verifying wiring intervals in wiring graphic data for wiring masks including vertical and horizontal wiring and slanted wiring created from layout data for a circuit design, the apparatus comprising:

an edge extraction unit extracting vertical and horizontal wiring edges and slanted wiring edges from overall wiring graphics;

a wiring width classification unit executing a scaling process for the overall wiring graphics and classifying the wiring graphics into wiring width ranges which are divided by a predefined reference wiring width;

a vertical and horizontal wiring edge extraction unit extracting the vertical and horizontal wiring edges which are in contact with graphics classified into the wiring width ranges;

a vertical and horizontal wiring interval verification unit verifying intervals between the vertical and horizontal wiring edges and opposed edges to be verification counterparts based on a vertical and horizontal reference interval for each wiring width range;

a slanted wiring edge extraction unit extracting slanted wiring edges which are in contact with graphics classified into the wiring width ranges; and a slanted wiring interval verification unit verifying intervals between the slanted wiring edges and opposed edges to be verification counterparts based on a slanted reference interval for each wiring width range.

15. A computer-aided wiring graphic verification apparatus for verifying wiring intervals and wiring widths in wiring graphic data for wiring masks including vertical and horizontal wirings and slanted wirings created from layout data for semiconductor integrated circuit designing, the apparatus comprising:

an edge extraction unit extracting vertical and horizontal wiring edges and slanted wiring edges from overall wiring graphics;

a wiring width classification unit executing a scaling process for the overall wiring graphics and classifying the wiring graphics into wiring width ranges which are divided by a predefined reference wiring width;

a vertical and horizontal wiring edge extraction unit extracting the vertical and horizontal wiring edges which are in contact with graphics classified into the wiring width ranges;

a vertical and horizontal wiring interval verification unit verifying intervals between the vertical and horizontal wiring edges and opposed edges to be verification counterparts based on a vertical and horizontal reference interval for each wiring width range;

a slanted wiring edge extraction unit extracting slanted wiring edges which are in contact with graphics classified into the wiring width ranges;

a slanted wiring interval verification unit verifying intervals between the slanted wiring edges and opposed edges to be verification counterparts based on a slanted reference interval for each wiring width range;

a minimum wiring width extraction unit extracting wiring graphics less than a predefined minimum wiring width through a scaling process for the overall wiring graphics;

a minimum wiring width verification unit extracting vertical and horizontal wiring graphics which are in contact with the vertical and horizontal wiring edges and slanted wiring graphics which are in contact with the slanted wiring edges out of the wiring graphics less than the minimum width, the minimum wiring width verification unit outputting minimum wiring width errors;

a maximum wiring width extraction unit extracting wiring graphics greater than predefined maximum width through a scaling process for the overall wiring graphics; and a maximum wiring width verification unit extracting vertical and horizontal wiring graphics which are in contact with the vertical and horizontal wiring edges and slanted wiring graphics which are contact with the slanted wiring edges out of the wiring graphics greater than the maximum width, the maximum wiring width verification unit outputting maximum wiring width errors.

* * * * *

UNITED STATES PATENT AND TRADEMARK OFFICE
CERTIFICATE OF CORRECTION

| | | |
|---|---|---|
| PATENT NO. | : 7,120,881 B2 | Page 1 of 1 |
| APPLICATION NO. | : 10/805478 | |
| DATED | : October 10, 2006 | |
| INVENTOR(S) | : Chikaaki Kodama et al. | |

It is certified that error appears in the above-identified patent and that said Letters Patent is hereby corrected as shown below:

Column 22, Line 27, after "zontal" change "wiring" to --wirings--.

Column 22, Line 27, after "slanted" change "wiring" to --wirings--.

Column 22, Line 31, change "extraction" to --extracting--.

Column 23, Line 2, change "with" to --width--.

column 23, Line 4, after "unit" change "extraction" to --extracting--.

Column 23, Line 53, change "graphic" to --graphics--.

Signed and Sealed this

Sixth Day of March, 2007

JON W. DUDAS
*Director of the United States Patent and Trademark Office*